(12) United States Patent
Blaydes et al.

(10) Patent No.: US 8,476,105 B2
(45) Date of Patent: Jul. 2, 2013

(54) METHOD OF MAKING A TRANSPARENT CONDUCTIVE OXIDE LAYER AND A PHOTOVOLTAIC DEVICE

(75) Inventors: Holly Ann Blaydes, Burnt Hills, NY (US); George Theodore Dalakos, Niskayuna, NY (US); David William Vernooy, Niskayuna, NY (US); Allan Robert Northrup, Schenectady, NY (US); Juan Carlos Rojo, Niskayuna, NY (US); Peter Joel Meschter, Niskayuna, NY (US); Hongying Peng, Clifton Park, NY (US); Hongbo Cao, Cohoes, NY (US); Yangang Andrew Xi, Schenectady, NY (US); Robert Dwayne Gossman, Aurora, CO (US); Anping Zhang, Rexford, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/976,166

(22) Filed: Dec. 22, 2010

(65) Prior Publication Data
US 2012/0164785 A1 Jun. 28, 2012

(51) Int. Cl.
*H01L 31/073* (2012.01)
*H01L 31/0224* (2006.01)
*C23C 14/00* (2006.01)
*H01L 31/18* (2006.01)
*C23C 14/08* (2006.01)

(52) U.S. Cl.
CPC ...... *H01L 31/022466* (2013.01); *H01L 31/073* (2013.01); *H01L 31/1836* (2013.01); *C23C 14/0036* (2013.01); *C23C 14/08* (2013.01)

USPC .......... 438/86; 438/84; 438/98; 438/603; 438/609; 136/260; 136/264; 257/744; 257/749

(58) Field of Classification Search
USPC ........ 438/95, 72, 69, 86, 96, 97; 257/E31.04, 257/E31.127; 136/258, 260
See application file for complete search history.

(56) References Cited

U.S. PATENT DOCUMENTS 3,811,953 A 5/1974 Nozik
4,349,425 A * 9/1982 Miyake et al. ........... 204/192.29

(Continued)

FOREIGN PATENT DOCUMENTS

GB 1519733 A 8/1978
GB 2013724 A 10/1978
WO 9847702 A1 10/1998

OTHER PUBLICATIONS

G. Haacke;"Reactive Sputtering From a Cd-Sn Target",Thin Solid Films,Preparation and Characterization, Received Jul. 25, 1985; accepted Oct. 4, 1985) Mar. 1, 1986,vol. 137,Issue 1,pp. 101-109.

(Continued)

*Primary Examiner* — Olik Chaudhuri
*Assistant Examiner* — Wilner Jean Baptiste
(74) *Attorney, Agent, or Firm* — Paul J. DiConza

(57) ABSTRACT

In one aspect of the present invention, a method is provided. The method includes disposing a substantially amorphous cadmium tin oxide layer on a support; and thermally processing the substantially amorphous cadmium tin oxide layer in an atmosphere substantially free of cadmium from an external source to form a transparent layer, wherein the transparent layer has an electrical resistivity less than about $2\times10^{-4}$ Ohm-cm. Method of making a photovoltaic device is also provided.

33 Claims, 13 Drawing Sheets

U.S. PATENT DOCUMENTS

| | | | |
|---|---|---|---|
| 4,371,740 | A | 2/1983 | Clem |
| 4,605,565 | A | 8/1986 | Nath |
| 5,397,920 | A | 3/1995 | Tran |
| 5,922,142 | A | 7/1999 | Wu et al. |
| 5,953,614 | A * | 9/1999 | Liu et al. ............... 438/303 |
| 6,137,048 | A | 10/2000 | Wu et al. |
| 6,169,246 | B1 | 1/2001 | Wu et al. |
| 6,221,495 | B1 | 4/2001 | Wu et al. |
| 6,288,325 | B1 | 9/2001 | Jansen et al. |
| 7,586,664 | B2 | 9/2009 | O'Shaughnessy |
| 7,648,783 | B2 | 1/2010 | Huang et al. |
| 2001/0054436 | A1 | 12/2001 | Mukai et al. |
| 2002/0117199 | A1* | 8/2002 | Oswald ............... 136/256 |
| 2007/0075327 | A1* | 4/2007 | Arai et al. ............... 257/103 |
| 2008/0169021 | A1 | 7/2008 | Krasnov |
| 2009/0272437 | A1 | 11/2009 | Roberts et al. |
| 2010/0055826 | A1 | 3/2010 | Zhong et al. |
| 2010/0126575 | A1 | 5/2010 | Bailat et al. |
| 2010/0243039 | A1* | 9/2010 | Korevaar et al. ............... 136/255 |
| 2011/0086462 | A1* | 4/2011 | Ovshinsky ............... 438/72 |

OTHER PUBLICATIONS

X. Wu, W.P. Mulligan, T.J. Courts; "Recent developments in RF sputtered cadmium starmate films", Thin Solid Films, Elsevier, Received Oct. 17, 1995; accepted Dec. 15, 1995, (1996), vol. 286, pp. 274-276.

Radhouane Bel Hadj Tahal, Takayuki Ban, Yutaka Ohya, Yasutaka Takahashi; "Effect of Processing Parameters on Physical Properties of Cadmium Stannate Thin Films Prepared by a Dip-Coating Technique", Journal of the American Ceramic Society, Jan. 2001, vol. 84, Issue 1, pp. 85-91.

Gintaras Valincius, Vytautas Reipa, Vincent Vilker, John T Woodward, Mark Vaudin; Electrochemical properties of Nanocrystalline cadmium stannate films, Journal of the Electrochemical Society, Electrochemical Society, Pennington, 2001, vol. 148, No. 8, pp. E341-E347.

X Wu, R.G. Dhere, J. Zhou, A. Duda, C. Perkins, Y. Yan, H.R. Moutinho; "High-Quality Cadmium Stannate Transparent Conductive Oxide Film far Tandem Thin-Film Solar Cells", 3rd World Conference on Phoiovollaic Enera' Conversion, May 2003, 4 Pages.

X. Li et al; " The properties of cadmium tin oxide thin-film compounds prepared by linear combinatorial synthesis", National Renewable Energy Laboratory, Science direct, Elsevier, Applied Surface Science, (2004), vol. 223, pp. 138-143.

Robert Mamazza Jr., Don L Morel, Christos S Ferekides; "Transparent conducting oxide thin films of Cd2SnO4 prepared by RF magnetron co-sputtering of the constituent binary oxides ", Science direct, Elsevier, Thin Solid films, (2005), vol. 484, pp. 26-33.

C.S. Ferekides, R. Mamazza, U. Balasubramanian, D.L. Morel; "Transparent conductors and buffer layers for CdTe solar cells", Science direct, Elsevier, Thin Solid films, (2005), vol. 480-481, pp. 224-229.

* cited by examiner

METHOD OF MAKING A TRANSPARENT CONDUCTIVE OXIDE LAYER AND A PHOTOVOLTAIC DEVICE

BACKGROUND

The invention generally relates to methods for forming transparent conductive oxide layers for photovoltaic devices. More particularly, the invention relates to methods for forming crystalline cadmium tin oxide layer by annealing in the absence of cadmium from an external source.

Thin film solar cells or photovoltaic devices typically include a plurality of semiconductor layers disposed on a transparent substrate, wherein one layer serves as a window layer and a second layer serves as an absorber layer. The window layer allows the penetration of solar radiation to the absorber layer, where the optical energy is converted to usable electrical energy. Cadmium telluride/cadmium sulfide (CdTe/CdS) heterojunction-based photovoltaic cells are one such example of thin films solar cells Typically, a thin layer of transparent conductive oxide (TCO) is deposited between the substrate and the window layer (for example, CdS) to function as a front contact current collector. However conventional TCOs, such as tin oxide, indium tin oxide, and zinc oxide, have high electrical resistivities at thickness necessary for good optical transmission. The use of cadmium tin oxide (CTO) as TCO provides better electrical, optical, and mechanical properties, as well as stability at elevated temperatures. However, CTO/CdS-based thin film solar cells still have challenges, for example, thick CdS films typically result in low device efficiencies whereas thin CdS films lead to reduced open circuit voltage ($V_{OC}$). In some instances, to achieve high device efficiencies with thin CdS films, a thin layer of a buffer material, such as a tin oxide ($SnO_2$) layer, is intercalated between the cadmium tin oxide (CTO) and the window (CdS) layers.

The typical method used to manufacture a high quality CTO layer includes depositing a layer of amorphous cadmium tin oxide on a substrate, followed by slow thermal annealing of the CTO layer, which is annealed in the presence of a CdS film in close proximity to the surface of the CTO film, to achieve desired transparency and resistivity. The use of expensive CdS for each annealing step may be economically disadvantageous for large-scale manufacturing as the CdS film is not reusable and the cost of the CdS and the glass support makes the process expensive on a large scale. Further, CdS-based annealing of CTO is difficult to implement in a large-scale continuous manufacturing environment, as the process requires assembly and disassembly of plates before and after the annealing steps.

Thus, there is a need to reduce the number of steps for depositing and annealing of CTO layer during manufacturing of photovoltaic devices, resulting in reduced costs and improved manufacturing capability. Further, there is a need to provide cost-effective electrodes and photovoltaic devices manufactured using cadmium tin oxide having the desired electrical and optical properties.

BRIEF DESCRIPTION OF THE INVENTION

Embodiments of the present invention are provided to meet these and other needs. One embodiment is a method. The method includes disposing a substantially amorphous cadmium tin oxide layer on a support; and thermally processing the substantially amorphous cadmium tin oxide layer in an atmosphere substantially free of cadmium from an external source to form a transparent layer, wherein the transparent layer has an electrical resistivity less than about $2\times10^{-4}$ Ohm-cm.

Another embodiment is a method. The method includes disposing a substantially amorphous cadmium tin oxide layer on a support by reactive sputtering from one or more target; and thermally processing the substantially amorphous cadmium tin oxide layer in an atmosphere substantially free of cadmium from an external source to form a transparent layer, wherein the transparent layer has an electrical resistivity less than about $2\times10^{-4}$ Ohm-cm.

Yet another embodiment is a method of making a photovoltaic device. The method includes disposing a substantially amorphous cadmium tin oxide layer on a support; thermally processing the substantially amorphous cadmium tin oxide layer in an atmosphere substantially free of cadmium from an external source to form a transparent layer, wherein the transparent layer has an electrical resistivity less than about $2\times10^{-4}$ Ohm-cm; disposing a first semiconductor layer on the transparent layer; disposing a second semiconductor layer on the first semiconductor layer; and disposing a back contact layer on the second semiconductor layer to form a photovoltaic device.

DRAWINGS

These and other features, aspects, and advantages of the present invention will become better understood when the following detailed description is read with reference to the accompanying drawings, wherein.

DETAILED DESCRIPTION

Figure 1:
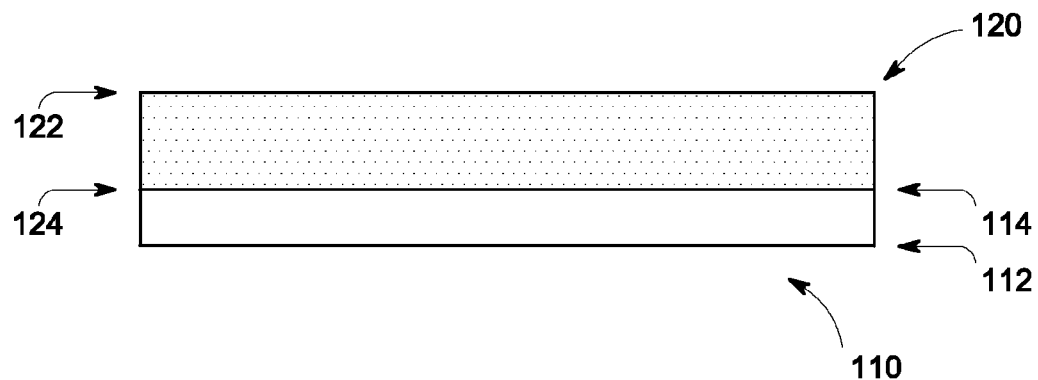
FIG. 1 is a schematic of a substantially amorphous cadmium tin oxide layer disposed on a support, according to an exemplary embodiment of the invention.

As discussed in detail below, some of the embodiments of the invention provide a method for forming crystalline cadmium tin oxide layer by annealing in the absence of an external source of cadmium. Some other embodiments of the invention provide a method for disposing an amorphous cadmium tin oxide film by reactive co-sputtering and forming crystalline cadmium tin oxide layer by annealing in the absence of an external source of cadmium. The methods may enable a cost-effective manufacturable process for forming crystalline cadmium tin oxide by eliminating the use of an expensive CdS/glass sacrificial part, typically used in CdS proximity annealing. Further, the methods allows for a continuous process obviating the need for assembly and disassembly of plates during the annealing process resulting in higher throughput and lower manufacturing costs.

The crystalline cadmium tin oxide films manufactured according to some embodiments of the invention have electrical and optical properties comparable to cadmium tin oxide films annealed using CdS film and significantly better than un-annealed cadmium tin oxide films or cadmium tin oxide films annealed in the absence of an external source of cadmium. In some embodiments, the amorphous cadmium tin oxide film is annealed advantageously in the absence of an external source of cadmium to obtain electrical resistivity less than about $2 \times 10^{-4}$ Ohm-cm, mobility greater than about 45 $cm^2/V$-s, and carrier density greater than about $8 \times 10^{20}$ $cm^3$. In a particular embodiment, the amorphous cadmium tin oxide film is annealed advantageously in the absence of an external source of cadmium to obtain electrical resistivity less than about $1.5 \times 10^{-4}$ Ohm-cm, mobility greater than about 50 $cm^2/$V-s, and carrier density greater than about $9 \times 10^{20}$ $cm^{-3}$. Crystalline CTO films having a combination of low absorbance, low resistivity, high mobility, and high carrier density may be desirable for advancing the efficiency and manufacturability of thin film solar cells. Method for making crystalline CTO films having such an advantageous combination of electrical and optical properties is provided according to some embodiments of the present invention. In some embodiments, by varying one or more of the sputtering conditions, annealing conditions, target composition, or the composition of the as-deposited cadmium tin oxide layer, the desired combination of electrical and optical properties of the crystalline cadmium tin oxide layer have been advantageously obtained.

Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In some instances, the approximating language may correspond to the precision of an instrument for measuring the value.

In the following specification and the claims, the singular forms "a", "an" and "the" include plural referents unless the context clearly dictates otherwise.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable, or suitable. For example, in some circumstances, an event or capacity can be expected, while in other circumstances the event or capacity cannot occur—this distinction is captured by the terms "may" and "may be".

The terms "transparent region", "transparent layer" and "transparent electrode" as used herein, refer to a region, a layer, or an article that allows an average transmission of at least 80% of incident electromagnetic radiation having a wavelength in a range from about 300 nm to about 850 nm. As used herein, the term "disposed on" refers to layers disposed directly in contact with each other or indirectly by having intervening layers therebetween.

As discussed in detail below, some embodiments of the invention are directed to a method for forming an improved crystalline cadmium tin oxide layer for a transparent electrode and a photovoltaic device. The method is described with reference to FIGS. 1-4. As indicated, for example, in FIG. 1 the method includes disposing a substantially amorphous cadmium tin oxide layer 120 on a support 110. The substantially amorphous cadmium tin oxide layer 120 includes a first surface 122 and a second surface 124. In one embodiment, the second surface 124 is contiguous to the support 110.

As used herein, the term "cadmium tin oxide" includes a composition of cadmium, tin, and oxygen. In some embodiments, cadmium tin oxide includes a stoichiometric composition of cadmium and tin, wherein, for example, the atomic ratio of cadmium to tin is about 2:1. In some other embodiments, cadmium tin oxide includes a non-stoichiometric composition of cadmium and tin, wherein, for example, the atomic ratio of cadmium to tin is in range less than about 2:1 or greater than about 2:1. As used herein, the terms "cadmium tin oxide" and "CTO" may be used interchangeably. In some embodiments, cadmium tin oxide may further include dopants, such as, for example, copper, zinc, calcium, yttrium, zirconium, hafnium, vanadium, tin, ruthenium, magnesium, indium, zinc, palladium, rhodium, titanium, fluorine, aluminum, or combinations thereof. "Substantially amorphous cadmium tin oxide" as used herein refers to a cadmium tin oxide layer that does not have a distinct crystalline pattern as observed by X-ray diffraction (XRD).

In certain embodiments, cadmium tin oxide may function as a transparent conductive oxide (TCO). Cadmium tin oxide as a TCO has numerous advantages including superior electrical, optical, surface, and mechanical properties and increased stability at elevated temperatures when compared to tin oxide, indium oxide, indium tin oxide, and other transparent conductive oxides.

The electrical properties of cadmium tin oxide may depend in part on the composition of cadmium tin oxide characterized in some embodiments by the atomic concentration of cadmium and tin, or alternatively in some other embodiments by the atomic ratio of cadmium to tin in cadmium tin oxide. Atomic ratio of cadmium to tin, as used herein, refers to the ratio of atomic concentration of cadmium to tin in cadmium tin oxide. Atomic concentrations of cadmium and tin and the corresponding atomic ratio are commonly measured using, for instance, x-ray photoelectron spectroscopy (XPS).

In one embodiment, the atomic ratio of cadmium to tin in the substantially amorphous CTO layer 120 is less than about 2.5:1. In another embodiment, the atomic ratio of cadmium to tin in the substantially amorphous CTO layer 120 is equal to or less than about 2:1. In yet another embodiment, the atomic ratio of cadmium to tin in the substantially amorphous CTO layer is 120 equal to or less than about 1.8:1. In one particular embodiment, the atomic ratio of cadmium to tin in the substantially amorphous CTO layer 120 is about 2:1. In one embodiment, the atomic ratio of cadmium to tin in the substantially amorphous CTO layer 120 is in a range from about 1.2:1 to about 2.5:1. In another embodiment, the atomic ratio of cadmium to tin in the substantially amorphous CTO layer 120 is in a range from about 1.4:1 to about 2.25:1. In yet another embodiment, the atomic ratio of cadmium to tin in the substantially amorphous CTO layer 120 is in a range from about 1.5:1 to about 2:1. In one particular embodiment, the atomic ratio of cadmium to tin in the substantially amorphous CTO layer 120 is in a range from about 1.7:1 to about 0.2:1.

In one embodiment, atomic concentration of cadmium in the substantially amorphous CTO layer 120 is in a range from about 20% to about 40% of the total atomic content of cadmium tin oxide. In another embodiment, atomic concentration of cadmium in the substantially amorphous CTO layer 120 is in a range from about 25% to about 35% of the total atomic content of cadmium tin oxide. In a particular embodiment, atomic concentration of cadmium in the substantially amorphous CTO layer 120 is in a range from about 28% to about 32% of the total atomic content of cadmium tin oxide. In one embodiment, atomic concentration of tin in the substantially amorphous CTO layer 120 is in a range from about 10% to about 30% of the total atomic content of cadmium tin oxide. In another embodiment, atomic concentration of tin in the substantially amorphous CTO layer 120 is in a range from about 15% to about 28% of the total atomic content of cadmium tin oxide. In a particular embodiment, atomic concentration of tin in the substantially amorphous CTO layer 120 is in a range from about 18% to about 24% of the total atomic content of cadmium tin oxide. In one embodiment, atomic concentration of oxygen in the substantially amorphous CTO layer 120 is in a range from about 30% to about 70% of the total atomic content of cadmium tin oxide. In another embodiment, atomic concentration of oxygen in the substantially amorphous CTO layer 120 is in a range from about 40% to about 60% of the total atomic content of cadmium tin oxide. In a particular embodiment, atomic concentration of oxygen in the substantially amorphous CTO layer 120 is in a range from about 44% to about 50% of the total atomic content of cadmium tin oxide.

In one embodiment, the substantially amorphous CTO layer 120 is disposed on the support 110 by any suitable technique, such as sputtering, evaporation, chemical vapor deposition, spin coating, spray coating, or dip coating. For example, in one embodiment, the substantially amorphous CTO layer 120 may be formed by dipping a support 110 into a solution of a reaction product containing cadmium and tin derived from a cadmium compound and a tin compound.

In a particular embodiment, the substantially amorphous CTO layer 120 is disposed on the support 110 by sputtering. The term "sputtering" as used herein refers to a physical vapor deposition (PVD) method of depositing thin films by ejecting material from a target or a source, which then deposits onto a substrate, such as, for example, support 110. In one embodiment, the substantially amorphous CTO layer 120 may be disposed on the support 110 by magnetron sputtering. The term "magnetron sputtering" as used herein refers to sputter deposition or etching with the aid of a magnetron using crossed electric and magnetic fields. In one embodiment, the substantially amorphous CTO layer 120 may be disposed on the support 110 by radio frequency (RF) magnetron sputtering or by direct current (DC) magnetron sputtering. RF sputtering or DC sputtering refers to a sputtering method in which a RF power source or a DC power source is employed respectively during the sputtering process. In some embodiments, a substantially amorphous CTO layer 120 is disposed on the support 110 by co-sputtering, that is, sputtering using a plurality of targets. In a particular embodiment, a substantially amorphous CTO layer 120 is disposed on the support 110 by sputtering from a single target. The sputtering target(s) may be manufactured, formed, or shaped by any process and in any shape, composition, or configuration suitable for use with any appropriate sputtering tool, machine, apparatus, or system.

In one embodiment, a substantially amorphous CTO layer 120 is disposed on the support 110 by sputtering from one or more target selected from a group consisting of cadmium oxide, tin oxide, and combinations thereof. In some embodiments, a substantially amorphous CTO layer 120 is disposed on the support 110 by co-sputtering, wherein a first target includes cadmium oxide and a second target includes tin oxide. In some embodiments, a substantially amorphous CTO layer 120 is disposed on the substrate by sputtering from a single target including a combination of cadmium oxide and tin oxide. In a particular embodiment, a substantially amorphous CTO layer 120 is disposed on the support 110 using a ceramic cadmium tin oxide target. In such instances, the substantially amorphous CTO layer 120 may be disposed on the support 110 by non-reactive sputtering methods, that is no reaction occurs between the ejected materials from the targets.

In one particular embodiment, the substantially amorphous CTO layer 120 is disposed on the support 110 by reactive sputtering. The term "reactive sputtering" as used herein refers to a sputtering method wherein the deposited film is formed by chemical reaction between the material ejected from the target and a reactive gas which is introduced into the vacuum chamber. The composition of the film may be controlled by varying the relative pressures of the inert and reactive gases. In one embodiment, the substantially amorphous CTO layer 120 is disposed on the support 110 by reactive sputtering in the presence of a reactive gas such as oxygen. In such instances, a substantially amorphous CTO layer 120 is disposed on the support 110 by sputtering from one or more target selected from a group consisting of cadmium, tin, and combinations thereof. In one embodiment, a substantially amorphous CTO layer 120 is disposed on the support 110 by reactive sputtering using a single metallic target, wherein the metallic target includes a mixture of cadmium and tin metals or by reactive co-sputtering using two different metal targets, that is, a cadmium target and a tin target.

The thickness, composition, and morphology of the sputtered CTO layer 120 may depend in part on the sputtering conditions employed such as, for example, the target composition, type of sputtering gas employed, volume of sputtering gas, sputtering pressure, or the sputtering power. Without being bound by theory, it is believed that by varying the sputtering conditions for depositing a substantially amorphous CTO layer 120, the resulting crystalline cadmium tin oxide layer having the desired optical and electrical properties may be advantageously prepared according to some embodiments of the invention.

In one embodiment, the atomic ratio of cadmium to tin in the deposited substantially amorphous CTO layer 120 may be directly proportional to the atomic ratio of cadmium to tin in the target(s). In some embodiments, the atomic ratio of cadmium to tin in the deposited substantially amorphous CTO layer 120 may be lower than the atomic ratio of cadmium to tin in the target(s). In some other embodiments, the atomic ratio of cadmium to tin in the deposited substantially amorphous CTO layer 120 may be substantially the same as the atomic ratio of cadmium to tin in the target(s). Without being bound by theory, it is believed that when depositing a substantially amorphous CTO layer 120 on the support 110 by reactive sputtering, the atomic concentration of cadmium and tin in the deposited layer may be directly proportional to the atomic concentration of cadmium and tin in the one or more sputtering target.

In one embodiment, the atomic ratio of cadmium to tin in the one or more sputtering target is in a range from about 1.2:1 to about 2.5:1. In another embodiment, the atomic ratio of cadmium to tin in the one or more sputtering target is in a range from about 1.4:1 to about 2.25:1. In yet another embodiment, the atomic ratio of cadmium to tin in the one or more sputtering target is in a range from about 1.5:1 to about 2:1. In one particular embodiment, the atomic ratio of cadmium to tin in one or more sputtering target is in a range from about 1.5:1 to about 1.8:1.

In one embodiment, a substantially amorphous CTO layer 120 is disposed on the support 110 by sputtering using oxygen gas as the sputtering atmosphere. In another embodiment, a substantially amorphous CTO layer 120 is disposed on the support 110 by sputtering using a mixture of oxygen and argon gases as the sputtering atmosphere. In some embodiments, the percentage content of oxygen gas is greater than about 90 percent by volume of the total amount of gas employed during the sputtering process. In some embodiments, the percentage content of oxygen gas is about 100 percent by volume of the total amount of gas employed during the sputtering process. In some other embodiments, the percentage content of oxygen gas is in a range from about 60 percent to about 100 percent by volume of the total amount of gas employed during the sputtering process. In one embodiment, the sputtering process is conducted using a power source at a sputtering power in a range from about 50 Watts to about 150 Watts. In one embodiment, the sputtering process is conducted at a sputtering pressure in a range from about 1 milliTorr to about 20 milliTorr.

In one embodiment, a substantially amorphous CTO layer 120 is disposed on the support 110 by sputtering using a cadmium tin oxide target having a cadmium to tin atomic ratio of about 2:1. The sputtering is conducted in an atmosphere containing oxygen and argon (wherein the concentration of oxygen is greater than 90%) and at a sputtering pressure of about 16 milliTorr. In another embodiment, a substantially amorphous CTO layer 120 is disposed on the support 110 by reactive sputtering using a cadmium and tin mixed metal target having a cadmium to tin atomic ratio of about 2:1. The sputtering is conducted using a power source of 150 W, a sputtering pressure of 8 milliTorr, and in an atmosphere containing 100% oxygen content.

In some embodiments, the thickness of the substantially amorphous CTO layer 120 is controlled by varying one or more of the processing parameters employed during the disposing step. In one embodiment, the thickness of the substantially amorphous CTO layer 120 is engineered to be in a range from about 50 nm to about 600 nm. In another embodiment, the substantially amorphous CTO layer 120 has a thickness in a range from about 100 nm to about 500 nm. In a particular embodiment, the substantially amorphous CTO layer 120 has a thickness in a range from about 200 nm to about 400 nm.

As indicated, for example, in FIG. 1, the support 110 further includes a first surface 112 and a second surface 114, wherein in one embodiment, the solar radiation is incident on the first surface 112 and the substantially amorphous CTO layer 120 is disposed adjacent to the second surface 114. In such instance, the configuration of the support 110 and CTO layer 120 is also referred to as "superstrate" configuration. In one embodiment, the support 110 is transparent over the range of wavelengths for which transmission through the support 110 is desired. In one embodiment, the support 110 may be transparent to visible light having a wavelength in a range from about 400 nm to about 1000 nm. In yet another embodiment, the thermal expansion coefficient of the support 110 is close to the thermal expansion coefficient of the substantially amorphous CTO layer 120 to prevent cracking or buckling of the substantially amorphous CTO layer 120 during heat treatment. In some embodiments, the support 110 includes a material capable of withstanding heat treatment temperatures greater than about 600° C., such as, for example silica and borosilicate glass. In some other embodiments, the support 110 includes a material that has a softening temperature lower than 600° C., such as, for example, soda-lime glass. In some embodiments certain other layers may be disposed between the substantially amorphous CTO layer 120 and the support 110, such as, for example, an anti-reflective layer, a index-matching layer, and/or a diffusion barrier layer.

Figure 2:
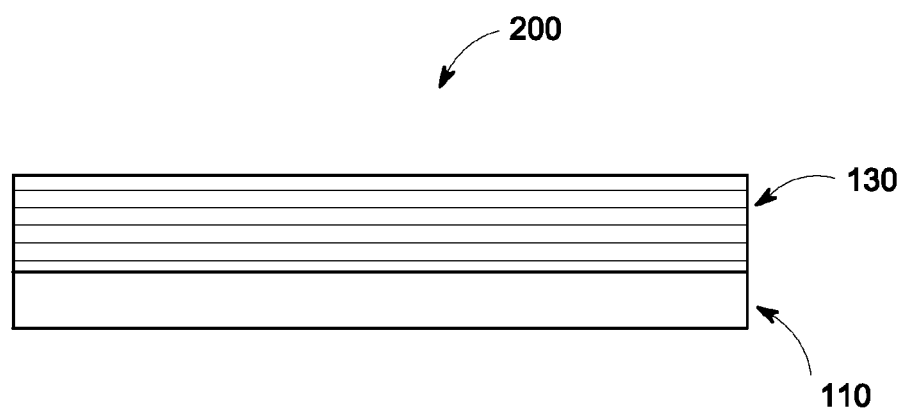
FIG. 2 is a schematic of a transparent layer disposed on a support, according to an exemplary embodiment of the invention.

In some other embodiments, as illustrated for example in FIG. 2, the substantially amorphous CTO layer 120 is disposed on a support 110, such that the solar radiation is incident on the first surface 131 of the transparent layer and the second surface 133 of the transparent layer is disposed adjacent to the second surface 114 of the support 110. In such instances, the configuration of the support 110 and CTO layer 120 is also referred to as "substrate" configuration. The support 110 includes a stack of plurality of layers, such as, for example, a back contact layer disposed on a back substrate, a second semiconducting layer disposed on the back contact layer, and a first semiconducting layer disposed on the second semiconducting layer. In such embodiments, the substantially amorphous CTO layer is disposed on the first semiconducting layer.

The method further includes thermally processing the substantially amorphous CTO layer 120 in an atmosphere substantially free of cadmium from an external source to form a transparent layer 120 as indicated in FIG. 2. In some embodiments, during thermally processing of the substantially amorphous CTO layer 120, loss of cadmium (for example by sublimation) or cadmium oxide (CdO) from the surface of the amorphous CTO layer 120 may occur, which may result in an annealing atmosphere that includes cadmium or CdO. Accordingly, "substantially free of cadmium from an external source" as used herein means that cadmium or cadmium oxide is not provided from an external source, although it may be present as a result of sublimation or surface decomposition from the amorphous CTO layer 120. Further, "substantially free of cadmium from an external source" as used herein means that vapor pressure of cadmium from an external source in the atmosphere in which thermal processing is being conducted is less than about 1 milli Torr In one embodiment, the method includes thermally processing the substantially amorphous CTO layer in an atmosphere having a cadmium vapor pressure less than about $10^{-4}$ Ton. In one embodiment, the method includes thermally processing the substantially amorphous CTO layer 120 in an atmosphere having a cadmium vapor pressure less than about $10^{-5}$ Torr.

In one embodiment, thermally processing the substantially amorphous CTO layer 120 in an atmosphere substantially free of cadmium refers to thermally processing the amorphous CTO layer 120 in the absence of a CdS film. In another embodiment, thermally processing the substantially amorphous CTO layer 120 in an atmosphere substantially free of cadmium refers to thermally processing the amorphous CTO layer 120 in the absence of any additional external source of cadmium that is conventionally used for annealing cadmium tin oxide, such as, for example, treating the amorphous CTO layer 120 with a solution including cadmium or cadmium source prior to, during, or after the annealing step.

The as-deposited CTO layer 120 is substantially amorphous. As noted earlier, the substantially amorphous CTO layer 120 is further thermally processed by heating the amorphous CTO layer 120 in an atmosphere substantially free of cadmium from an external source. In some embodiments, thermally processing the amorphous CTO layer 120 forms a transparent layer 130 that includes cadmium tin oxide having a substantially single-phase spinel crystal structure. Accordingly, the thermal processing step of the present invention eliminates the additional step of preparing a CdS film on a substrate that is later used for annealing of CTO. Further, it also reduces the amount of CdS used in the fabrication of a photovoltaic device, and is economically advantageous as CdS is an expensive material.

In one embodiment, thermal processing of the substantially amorphous CTO layer 120 includes heating the substantially amorphous CTO layer 120 at a treatment temperature, under vacuum conditions, and for time duration sufficient to allow formation of the transparent layer 130 having the desired electrical and optical properties. The composition, thickness, morphology, electrical properties, and optical properties of the transparent layer 130 may be advantageously controlled by varying one or more of treatment temperature, time duration of heat treatment, and vacuum conditions employed during heat treatment.

In one embodiment, the substantially amorphous CTO layer 120 is heated at a treatment temperature in a range from about 500° C. to about 700° C. In another embodiment, the substantially amorphous CTO layer 120 is heated at a treatment temperature in a range from about 550° C. to about 680° C. In a particular embodiment, the substantially amorphous CTO layer 120 is heated at a treatment temperature in a range from about 600° C. to about 650° C.

In one embodiment, the substantially amorphous CTO layer 120 is heated at the treatment temperature for a time duration in a range from about 1 minute to about 70 minutes. In another embodiment, the substantially amorphous CTO layer 120 is heated at the treatment temperature for a time duration in a range from about 10 minutes to about 60 minutes. In a particular embodiment, the substantially amorphous CTO layer 120 is heated at the treatment temperature for a time duration in a range from about 20 minutes to about 40 minutes. The time duration for annealing refers to the time for which the CTO layer 120 is subjected to the annealing temperature in the annealing furnace. The time duration for annealing does not include the initial ramping period during which the CTO film is ramped to the annealing temperature. Accordingly, an annealing time duration of 20 minutes means that once the CTO film reached the annealing temperature after the ramping period, it is subjected to annealing temperature for a time duration of 20 minutes. In some other embodiments, the annealing time duration may be in a range from about 0 seconds to about 15 seconds. An annealing time duration of 0 seconds means that once the CTO film reaches the annealing temperature after the ramping period, it is immediately removed from the furnace.

The thermal annealing process is further controlled by varying the pressure conditions employed during thermal processing. In one embodiment, thermal annealing is carried out under vacuum conditions, defined here in as pressure conditions less than atmospheric pressure. In some embodiments, thermal processing may be carried out in the presence of argon or nitrogen gas at a constant pressure. In some other embodiments, thermal processing may be carried out under dynamic pressure by continuous pumping. In one embodiment, thermal processing is conducted in the presence of nitrogen gas at a pressure less than about 500 Torr. In another embodiment, thermal processing is conducted in the presence of argon gas at a pressure equal to or less than about 250 Torr. In yet another embodiment, thermal processing is conducted in the presence of argon gas at a pressure in a range from about 90 Torr to about 490 Torr. In some other embodiments, thermal processing is conducted in the presence of argon gas at a pressure in a range from about 500 Torr to about 1 bar. "Pressure conditions" as used herein refer to the actual pressure of the sample during the annealing process.

As noted above, the thermal annealing of the substantially amorphous CTO layer 120 results in formation of a transparent layer 130. In one embodiment, the transparent layer 130 includes substantially uniform single-phase polycrystalline CTO, formed for example, by annealing the substantially amorphous CTO layer 120. In some embodiments, the substantially crystalline cadmium tin oxide has an inverse spinel crystal structure. The substantially uniform single-phase crystalline CTO that forms the transparent layer 130 is referred to herein as "cadmium tin oxide" as distinguished from a "substantially amorphous CTO" layer 120 that is disposed on the support 110 and thermally treated to form the transparent layer 130. In some embodiments, the transparent layer may have the desired electrical and optical properties and may function as a transparent conductive oxide (TCO) layer. In some embodiments, the transparent layer 130 may further include an amorphous component, such as for example, amorphous cadmium oxide, amorphous tin oxide, or combinations thereof.

In one embodiment, the transparent layer 130, as indicated, for example, in FIG. 2 includes a substantially homogeneous concentration of cadmium tin oxide across the thickness of the layer 130. In such instance, the atomic concentrations of cadmium and tin in the transparent layer are substantially constant across the thickness of the layer. The term "substantially constant" as used herein means that the variation in the atomic concentrations of cadmium and tin is less than about 10% across the thickness of the transparent layer 130.

Figure 3:
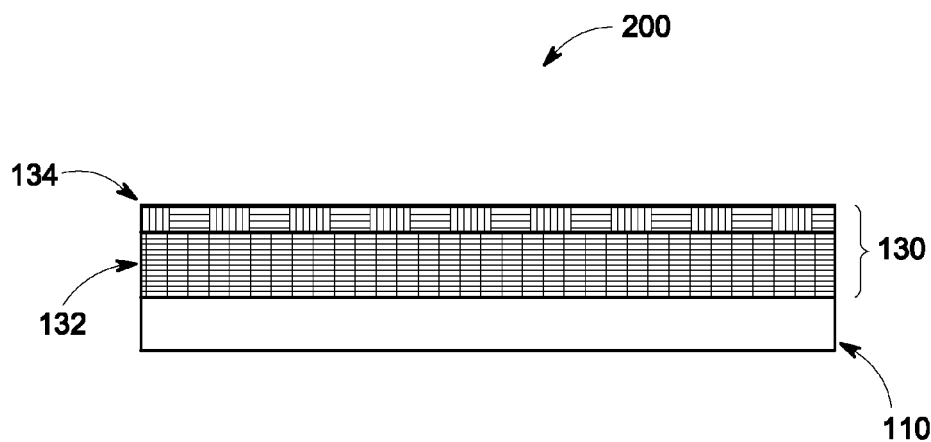
FIG. 3 is a schematic of a transparent layer disposed on a support, according to an exemplary embodiment of the invention.

In another embodiment, the transparent layer, as indicated, for example, in FIG. 3, includes a first region 132 and a second region 134. The first region 132 includes cadmium tin oxide and the second region 134 includes tin and oxygen. In some embodiments, the second region 134 further includes cadmium and an atomic concentration of cadmium in the second region 134 is lower than an atomic concentration of cadmium in the first region 132. Accordingly, in such instances, thermal annealing of the substantially amorphous CTO layer 120 results in formation of a transparent layer 130 having a cadmium-depleted region within the second region 134. In one embodiment, the atomic concentration of cadmium in the second region 134 is less than about 20% of the total atomic content of the second region 134.

The transparent layer may be further characterized by one or more of thickness, electrical properties, or optical properties. In one embodiment, the transparent layer 130 has a thickness in a range from about 100 nm to about 600 nm. In another embodiment, the transparent layer 130 has a thickness in a range from about 150 nm to about 450 nm. In a particular embodiment, the transparent layer 130 has a thickness in a range from about 100 nm to about 400 nm. In some embodiments, the transparent layer 130 has an average optical transmission greater than about 80%. In some other embodiments, the transparent layer 130 has an average optical transmission greater than about 90%. In a particular embodiment, the transparent layer 130 has an average optical transmission greater than about 95%.

The transparent layer 130, which may function as a TCO layer may be further characterized by its electrical resistivity, mobility, and carrier density values. In some embodiments, the transparent layer 130 has an electrical resistivity ($\rho$) that is less than about $2 \times 10^{-4}$ Ohm-cm. In some other embodiments, the transparent layer 130 has an electrical resistivity ($\rho$) that is less than about $1.75 \times 10^{-4}$ Ohm-cm. In a particular embodiment, the transparent layer 130 has an electrical resistivity ($\rho$) that is less than about $1.5 \times 10^{-4}$ Ohm-cm. In some embodiments, the transparent layer 130 has a mobility that is greater than about 45 $m^2$/V-s. In some other embodiments, the transparent layer 130 has a mobility that is greater than about 50 $m^2$/V-s. In a particular embodiment, the transparent layer 130 has a mobility that is greater than about 60 $cm^2$/V-s. In some embodiments, the transparent layer 130 has a carrier density that is greater than about $7 \times 10^{20}$ $cm^{-3}$. In some other embodiments, the transparent layer 130 has a carrier density that is greater than about $8 \times 10^{20}$ $cm^{-3}$. In a particular embodiment, the transparent layer 130 has a carrier density that is greater than about $9 \times 10^{20}$ $cm^{-3}$.

As noted herein earlier, the thermal processing step is carried out in the absence of a CdS film that is conventionally used for annealing cadmium tin oxide. Accordingly, the thermal processing step of the present invention eliminates the additional step of preparing a sacrificial CdS film on a non reusable-substrate that is later used for annealing of cadmium tin oxide and obtain a crystalline CTO layer having the desired electrical and optical properties. Further, the thermal processing step also reduces the amount of CdS used in the fabrication of a photovoltaic device, and is economically advantageous as CdS is an expensive material. The method also allows for a continuous process for forming the CTO layer with minimal intervention that is typically required for assembly/disassembly of the CTO and the CdS layers before and after the annealing process. Accordingly, the annealing process of the present invention also results in reduced processing time leading to higher throughputs, which may lead to lower manufacturing costs.

Figure 4:
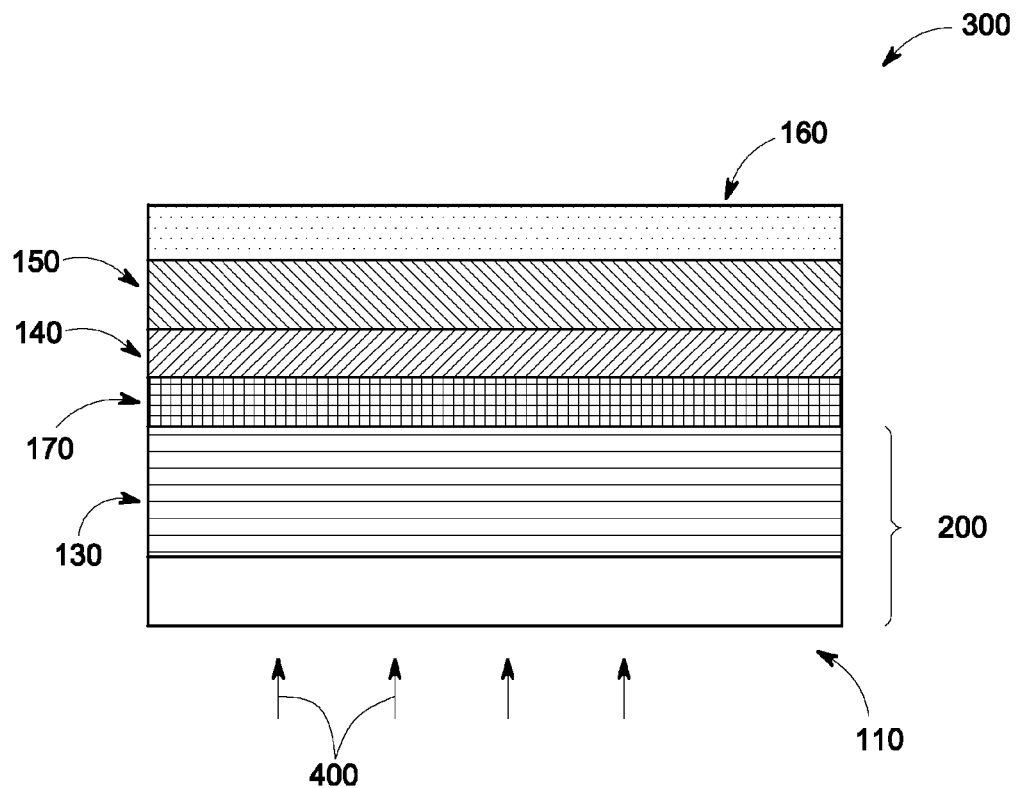
FIG. 4 is a schematic of a photovoltaic device, according to an exemplary embodiment of the invention.

As discussed in detail below, some embodiments of the invention are further directed to methods for making photovoltaic devices. The method is described with reference to FIG. 4 in one embodiment. As indicated, for example, in FIG. 4, the method further includes disposing a first semiconductor layer 140 on the transparent layer 130; disposing a second semiconductor layer 150 on the first semiconductor layer 140; and disposing a back contact layer 160 on the second semiconductor layer 150 to form a photovoltaic device 300. As noted herein earlier, the annealing step obviates the need for one or more additional manufacturing steps employed during conventional annealing of substantially amorphous CTO using a CdS film. The configuration as shown in FIG. 4 is typically referred to as "superstrate" configuration, wherein the solar radiation 440 is incident on the support 110. Accordingly, in such a configuration, it is desirable that the support 110 is substantially transparent.

Figure 5:
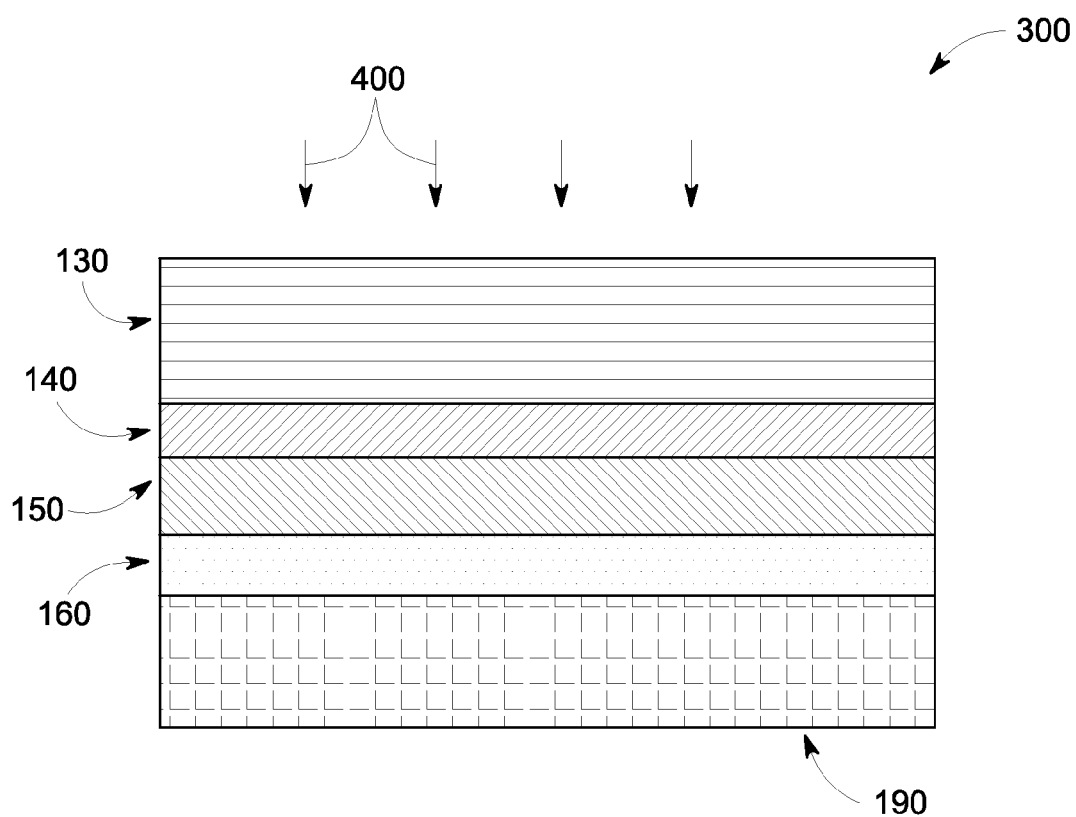
FIG. 5 is a schematic of a photovoltaic device, according to an exemplary embodiment of the invention.

In one embodiment, the method of making a photovoltaic device in "substrate" configuration is provided. The method includes forming a transparent layer 130 as described earlier on a support 110, such that the solar radiation 400 is incident on transparent layer 130, as shown in FIG. 5. In such embodiment, the support 110 includes a back contact layer 160 disposed on a back substrate 190, a second semiconducting layer 150 disposed on the back contact layer 160, a first semiconducting layer 140 disposed on the second semiconducting layer 150, and the transparent layer 130 disposed on the first semiconducting layer 140. In such a configuration as solar radiation is incident on the transparent layer 130, the back substrate may include a metal.

In some embodiments, the first type semiconductor layer 140 and the second semiconductor layer 150 may be doped with a p-type dopant or n-type dopant to form a heterojunction. As used in this context, a heterojunction is a semiconductor junction, which is composed of layers of dissimilar semiconductor material. These materials usually have non-equal band gaps. As an example, a heterojunction can be formed by contact between a layer or region of one conductivity type with a layer or region of opposite conductivity, e.g., a "p-n" junction.

In some embodiments, the second semiconductor layer 150 includes an absorber layer. The absorber layer is a part of a photovoltaic device where the conversion of electromagnetic energy of incident light (for instance, sunlight) to electron-hole pairs (that is, to electrical current) occurs. A photoactive material is typically used for forming the absorber layer. Suitable examples of photo-active materials include cadmium telluride (CdTe), cadmium zinc telluride (CdZnTe), cadmium magnesium telluride (CdMgTe), cadmium manganese telluride (CdMnTe), cadmium sulfur telluride (CdSTe), zinc telluride (ZnTe), CIS (copper, indium, sulphur), CIGS (copper, indium, gallium, selenium), CZTS (copper, zinc, tin, sulfur) and combinations thereof. The above-mentioned photo-active semiconductor materials may be used alone or in combination. Further, these materials may be present in more than one layer, each layer having different type of photoactive material or having combinations of the materials in separate layers. In one particular embodiment, the second semiconductor layer 150 or the absorber layer includes cadmium telluride (CdTe) as the photo-active material. CdTe is an efficient photo-active material that is used in thin-film photovoltaic devices. CdTe is relatively easy to deposit and therefore is considered suitable for large-scale production. In one embodiment, the second semiconductor layer 150 has a thickness in a range from about 1500 nm to about 4000 nm.

The first semiconductor layer 140 is disposed adjacent to the transparent layer 130. In a particular embodiment, the first semiconductor layer 140 includes cadmium sulfide (CdS) and may be referred to as the "window layer". In one embodiment, the first semiconductor layer 140 has a thickness in a range from about 30 nm to about 150 nm. A back contact layer 160 is further disposed adjacent to the second semiconductor layer 150 and is in ohmic contact therewith. Back contact layer 160 may include a metal, semiconductor, or combination thereof. In some embodiments, a back contact layer 160 may include gold, platinum, molybdenum, or nickel, or zinc telluride. In some embodiments, one or more additional layers may be interposed between the second semiconductor layer 150 and the back contact layer 160, such as, for example, a p+-type semiconductor layer. In some embodiments, the second semiconductor layer 150 may include p-type cadmium telluride (CdTe) that may be further treated or doped to improve the back contact resistance, such as for example, by cadmium chloride treatment or by forming a zinc telluride or copper telluride layer on the backside. In one embodiment, the back contact resistance may be improved by increasing the p type carriers in the CdTe material to form a p+ type layer on the backside of the CdTe material that is in contact with the back contact layer.

In some embodiments, the method further includes disposing a buffer layer 170 between the transparent layer and the first semiconductor layer 140, as indicated, for example in FIG. 4. In one embodiment, the buffer layer 170 includes an oxide selected from the group consisting of tin oxide, indium oxide, zinc oxide, zinc stannate, and combinations thereof. In a particular embodiment, the buffer layer 170 includes tin oxide or ternary mixed oxide thereof.

One or more of the first semiconductor layer 140, second semiconductor layer 150, back contact layer 160, or the buffer layer 170 (optional) may be deposited by one or more of the following techniques: sputtering, evaporation, electrodepositing, screen printing, spraying, physical vapor depositing, or closed space sublimation. One or more of these layers may be further heated or subsequently treated to manufacture the photovoltaic device 300.

EXAMPLES

The following examples are presented to further illustrate certain embodiments of the present invention. These examples should not be read to limit the invention in any way.

Example 1

Non Reactive Sputtering of Cadmium Tin Oxide Layer from a Ceramic Target

Thin films of cadmium tin oxide (CTO) were prepared on a 1.3 mm thick glass support by non-reactive magnetron direct current (DC) sputtering from a pre-reacted cadmium stannate target having a Cd:Sn ratio of about 2:1. The sputtering process was performed in an atmosphere containing oxygen and argon (wherein the concentration of oxygen was greater than 90%) at a pressure of about 16 mTorr. The thickness of the sputtered CTO film was about 230 nm Cadmium to tin ratio in the sputtered films was determined by Inductively coupled plasma spectroscopy (ICP) and X-ray fluroescence spectroscopy (XRF) and was about 1.77.

Example 2

Annealing of Non-Reactively Sputtered Cadmium Tin Oxide Using CdS Film

Samples prepared in Example 1 were annealed by placing the CTO films prepared above in contact with a CdS-coated glass support (referred to herein as CdS proximity annealing or "CPA"). The assembly was heated to a temperature of 630° C. for about 20 minutes in the presence of argon at a pressure of about 160 Torr.

Example 3

Annealing of Non-Reactively Sputtered Cadmium Tin Oxide Without CdS Film

Thin films of cadmium tin oxide (CTO) were prepared on a glass support using the method as described in Example 1. Three CTO samples (1.5 inch×1.5 inch) were cut and sealed in 2 inch diameter quartz tubes. After the CTO samples were loaded into the quartz tube, vacuum was applied. Subsequently, the tube was either kept under vacuum or back filled with 50 Torr and 100 Torr of $N_2$, respectively. The CTO samples were annealed at 630° C. for 20 minutes in a three-zone tube furnace connected to a vacuum chamber, which was pre-heated to a temperature of 630° C. prior to annealing. As noted, the time duration for annealing refers to the time for which the CTO film was subjected to the annealing temperature in the furnace. The time duration does not include the initial ramping period during which the CTO film is ramped to the annealing temperature. Accordingly, an annealing time duration of 0 minutes means that once the CTO film reached the annealing temperature after the ramping period, it was removed from the furnace immediately. A typical ramp rate of 2-3° C./sec was employed for the annealing experiments. To further understand the effect of ramp rate on electrical properties, a range of ramp rates from 0.28° C./sec to 20° C./sec were also used.

Three different samples were accordingly prepared under three different pressure conditions: ~200 Torr (Sample 1), ~90 Torr (Sample 2), and ~8×10$^{-3}$ Torr (Sample 3). "Pressure conditions" as used herein refer to the actual pressure of the sample during the annealing process and not the gas pressure. Annealing in the absence of CdS or an external source of cadmium is referred to herein as standard thermal annealing process or "STA".

The sheet resistance of the CTO samples annealed with or without CdS films was measured using a 4-point probe, locating the probe near the center of the sample. The total transmission and reflection were measured using a Cary UV-Vis spectrophotometer to compute the optical absorption as a function of wavelength. The total absorption was then computed between 325 and 850 nm weighted to the solar photon flux spectrum.

Figure 6:
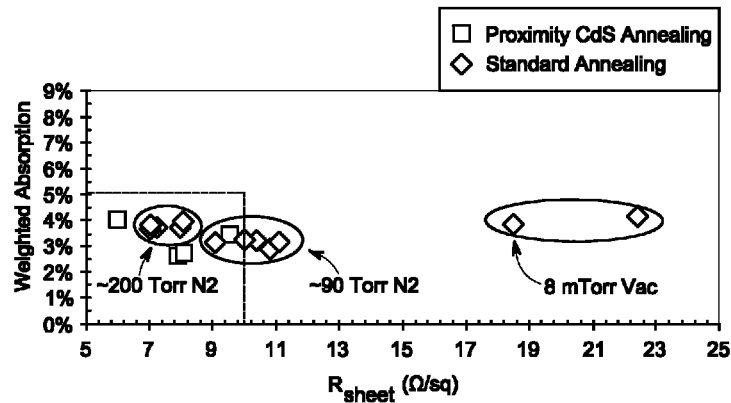
FIG. 6 shows the weighted absorption versus sheet resistance for transparent layer formed by CdS proximity annealing and standard thermal annealing, according to an exemplary embodiment of the invention.

FIG. 6 shows the weighted absorption and sheet resistance values for CTO samples annealed in the absence of CdS film (Example 2) as compared to CTO samples annealed in the presence of CdS film (Example 1). FIG. 6 shows that the absorption and sheet resistance values of samples annealed in the absence of cadmium (STA-annealed) are comparable to the values obtained by annealing in the presence of CdS film (CPA-annealed). Further, sheet resistance ($R_{sheet}$)~7.39±0.5 Ω/sq and 3.81±0.11% optical absorption was obtained by annealing at 630° C. for 20 minutes under 200 Torr of annealing pressure (as illustrated in FIG. 6). For the same annealing temperature and time, the sheet resistance decreased as the pressure was increased from 8×10$^{-3}$ Torr to 200 Torr. Table 1 summarizes the optical and electrical properties from Hall measurements for samples annealed in the absence of CdS film.

TABLE 1

Electrical and optical properties of samples annealed in the absence of CdS film.

| Sample | Annealing Pressure (Torr) | Thickness (nm) | $R_{sheet}$ (Ω/sq) | Absorption | Resistivity (Ωcm) | Mobility (cm$^2$/V · s) | Carrier. Concentration. (cm$^{-3}$) |
|---|---|---|---|---|---|---|---|
| 1 | ~200 | 214 | 7.01 | 3.86% | 1.47E−04 | 47.1 | 9.00E+20 |
| 2 | ~90 | 214 | 10.78 | 2.94% | 2.12E−04 | 45.7 | 6.44E+20 |

Figure 7:
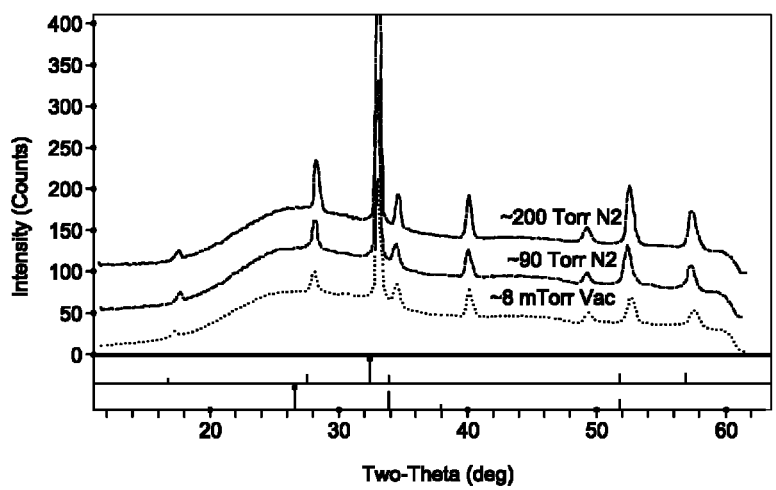
FIG. 7 shows the XRD patterns of a transparent layer, according to an exemplary embodiment of the invention.

FIG. 7 shows the X-ray diffraction patterns obtained from the three set of samples annealed at three different pressures illustrating that in all cases, the annealed films consisted of only spinel cadmium tin oxide phase, with no detectable presence of tin oxide or other secondary phases. The XRD patterns also seemed to indicate that better crystal quality, for example, sharper and narrower Bragg peaks, may be directly correlated with lower sheet resistance values, as indicated for example for CdS film annealed at 200 Torr.

Figure 8A:
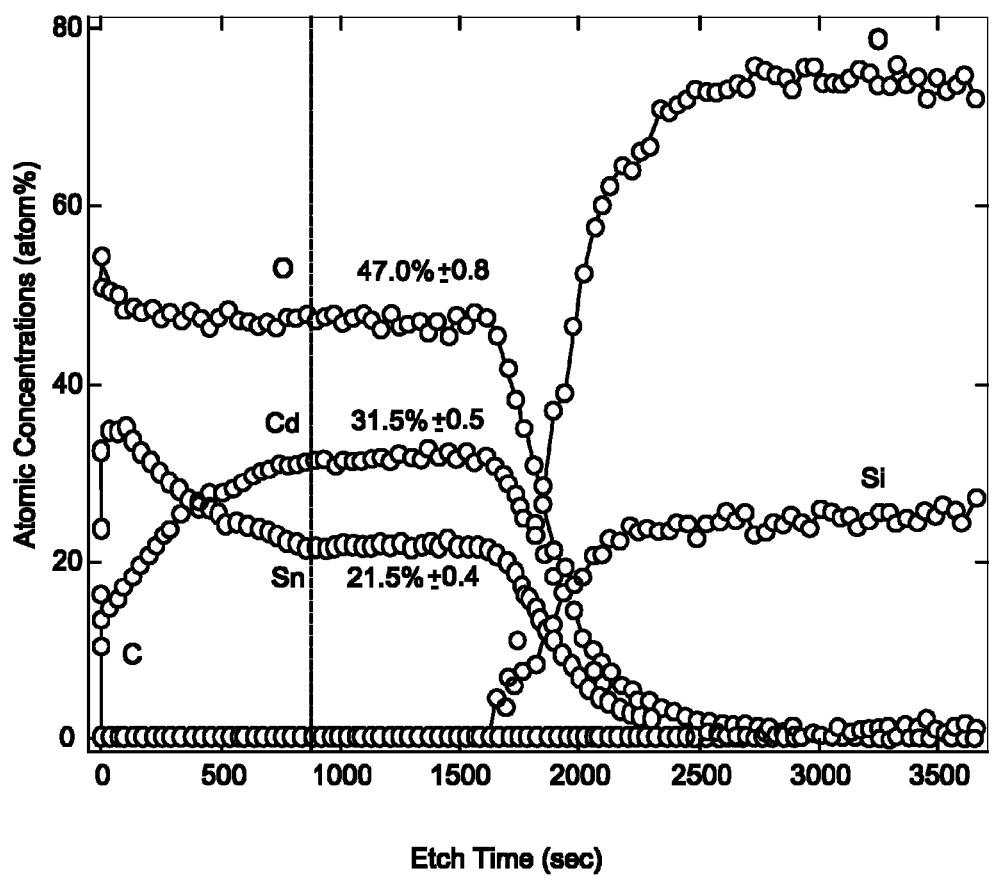
FIG. 8A shows a XPS profile of a transparent layer, according to an exemplary embodiment of the invention.
Figure 8B:
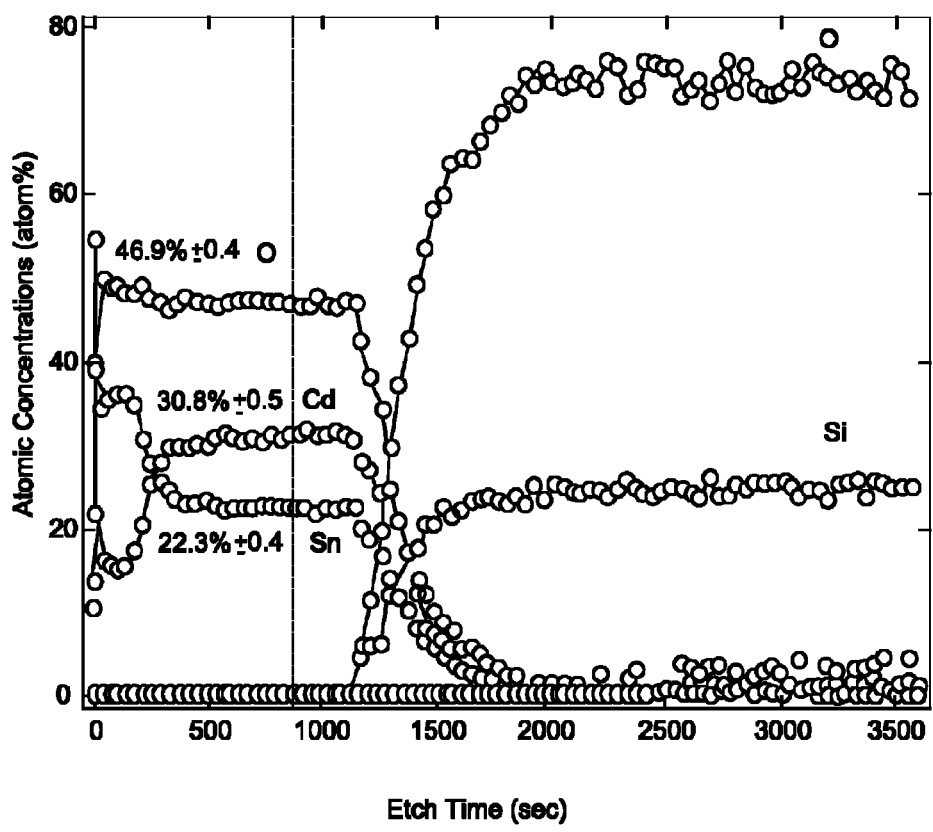
FIG. 8B shows a XPS profile of a transparent layer, according to an exemplary embodiment of the invention.

FIGS. 8A and 8B show the XPS depth profiles of cadmium tin oxide film annealed under vacuum at 200 Torr and 90 Torr, respectively. XPS depth profiles for samples annealed under 90 and 200 Torr indicate a cadmium-depleted region (second region) close to the surface in both the samples. Further, the XPS depth profiles indicate that the cadmium to tin atomic ratio in the bulk of the sample (first region) is in a range from about 1.4 to about 1.5 for the two samples after the annealing step.

Figure 9:
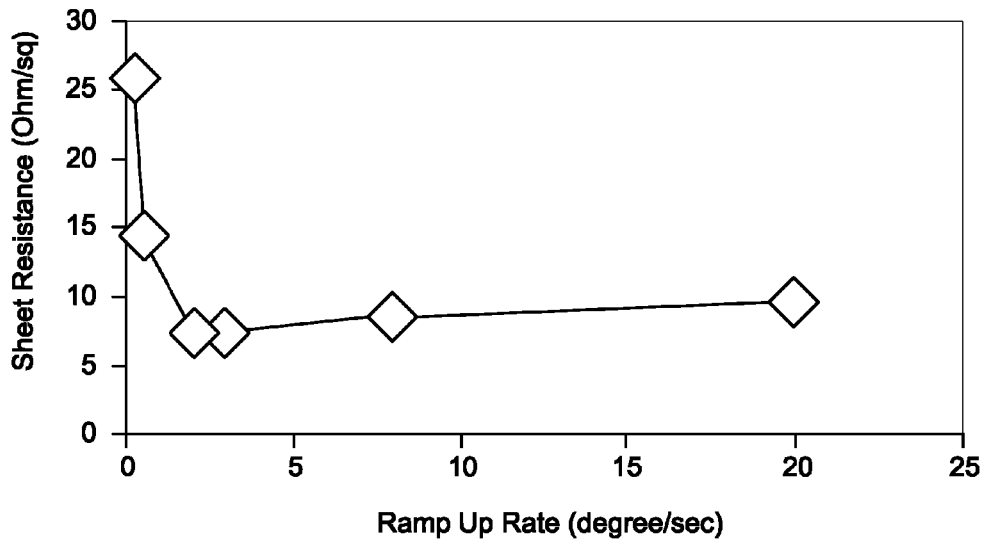
FIG. 9 shows the effect of ramp rate on the sheet resistance, according to an exemplary embodiment of the invention.

FIG. 9 shows the effect of ramp rate on sheet resistance of annealed CTO films. A slow ramp rate seemed to increase $R_{sheet}$ dramatically and an optimum ramp rate of 2-3° C./sec has been determined.

Example 4

Reactive Sputtering of Cadmium Tin Oxide Layer from a Mixed Metal Target

CTO films were formed on a borosilicate glass by reactive sputtering from a mixed metal target in the presence of oxygen at different sputtering pressures. Three different mixed metal targets having cadmium to tin atomic ratio of about 1.5:1, 2:1, and 2.5:1 were sputtered using different oxygen concentrations and sputtering pressures. Table 2 shows the different sputtering conditions used for the different targets and the corresponding thickness of the as-deposited cadmium tin oxide layer.

TABLE 2

Reactive sputtering conditions used for the different targets and the corresponding thickness of the as-deposited cadmium tin oxide layer.

| Target Cd:Sn Atomic Ratio | Oxygen (Vol %) | Sputtering Power (W) | Sputtering Pressure (mTorr) | Thickness (nm) |
|---|---|---|---|---|
| 1.5:1 | 100 | 60 | 8 | 213 |
| 1.5:1 | 100 | 100 | 8 | 216 |
| 1.5:1 | 100 | 100 | 16 | 228 |
| 1.5:1 | 100 | 150 | 8 | 216 |
| 1.5:1 | 100 | 150 | 16 | 220 |
| 2:1 | 100 | 50 | 8 | 210 |
| 2:1 | 100 | 100 | 8 | 224 |
| 2:1 | 100 | 100 | 8 | 224 |
| 2:1 | 100 | 100 | 16 | 225 |
| 2:1 | 100 | 150 | 8 | 226 |
| 2.5:1 | 100 | 150 | 8 | 235 |
| 2.5:1 | 60 | 150 | 8 | 221 |
| 2.5:1 | 60 | 100 | 8 | 229 |
| 2.5:1 | 80 | 100 | 8 | 246 |
| 2.5:1 | 80 | 150 | 8 | 248 |

Example 5

Annealing of Reactively Sputtered Cadmium Tin Oxide Using CdS Film

Cadmium-proximity annealing (CPA) was carried out by placing the CTO films prepared above in Example 4 in contact with a CdS-coated glass support. The assembly was heated to a temperature of 630° C. for about 20 minutes in the presence of $N_2$ gas at a pressure in a range from about 80 Torr to about 250 Torr.

Example 6

Annealing of Reactively Sputtered Cadmium Tin Oxide Without CdS Film

Standard thermal annealing (STA) on samples prepared in Example 4 was carried out using the method described in Example 2 by heating the sputtered films at an annealing temperature of 630° C. for 20 minutes and in the presence of $N_2$ gas at an annealing pressure of about 200 Torr.

The sheet resistance of the CTO samples annealed with or without CdS films was measured using a 4-point probe, locating the probe near the center of the sample. The total transmission and reflection were measured using a Cary UV-Vis spectrophotometer to compute the optical absorption as a function of wavelength. The total absorption was then computed between 325 nm and 850 nm weighted to the solar photon flux spectrum.

Figure 10:
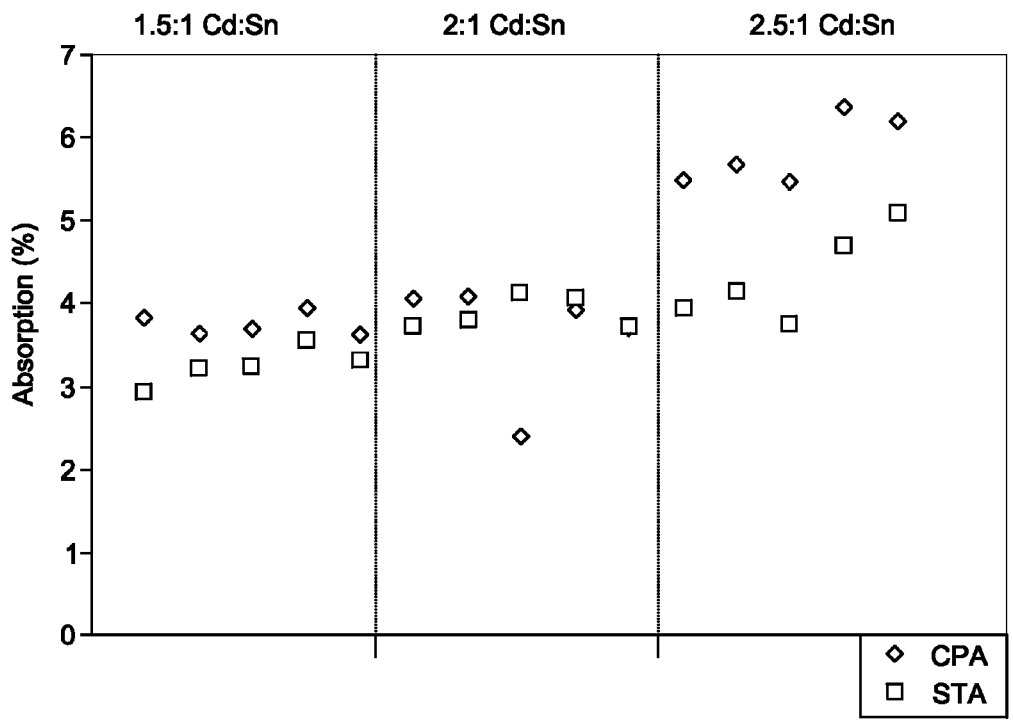
FIG. 10 shows the percentage absorbance of transparent layer deposited by reactive sputtering using targets having different Cd:Sn atomic ratios, according to an exemplary embodiment of the invention.

FIG. 10 shows the comparison between percentage absorbance values for CPA and STA-annealed CTO films reactively sputtered using different target concentrations and using different sputtering conditions. As illustrated in FIG. 10, the percentage absorbance seemed to increase with increase in cadmium to tin atomic ratio. At a cadmium to tin atomic ratio of 2:1, the percentage absorbance values were comparable between the CPA and STA-annealed CTO films. As shown in FIG. 10, the resistivity values increase as cadmium to tin atomic ratio increases from 2:1 to 2.5:1.

Figure 11:
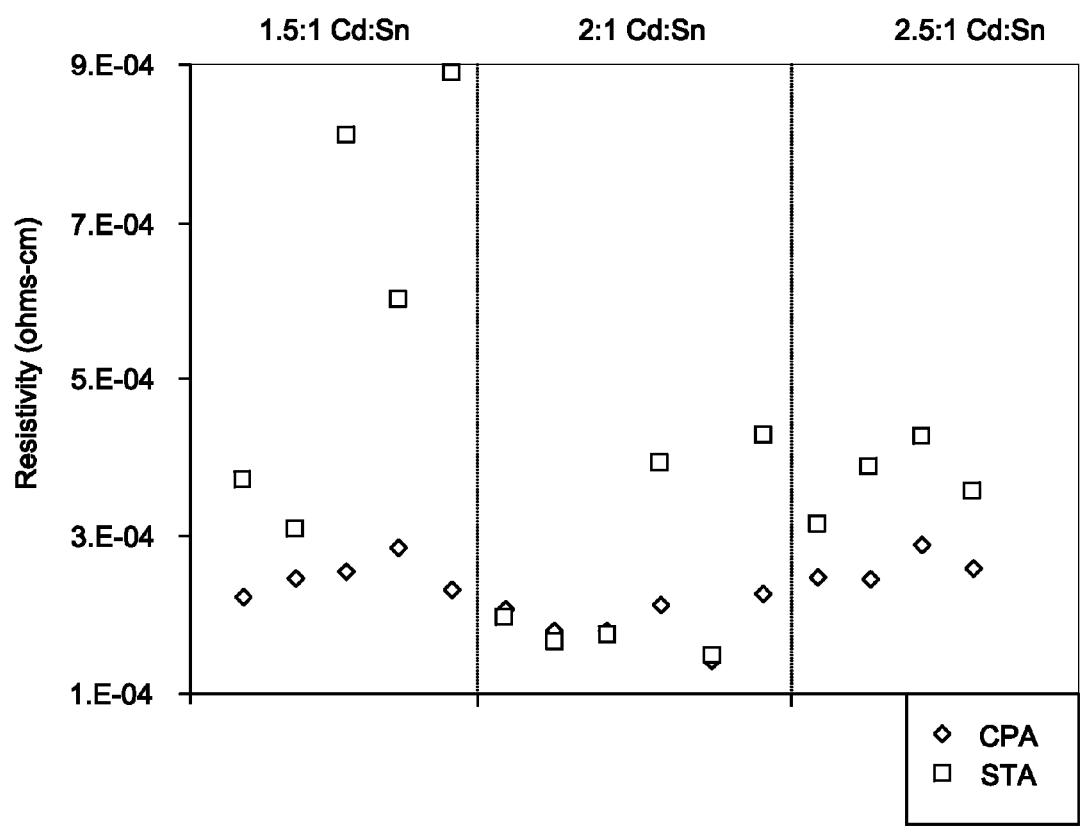
FIG. 11 shows the electrical resistivity of transparent layer deposited by reactive sputtering using targets having different Cd:Sn atomic ratios, according to an exemplary embodiment of the invention.
Figure 12:
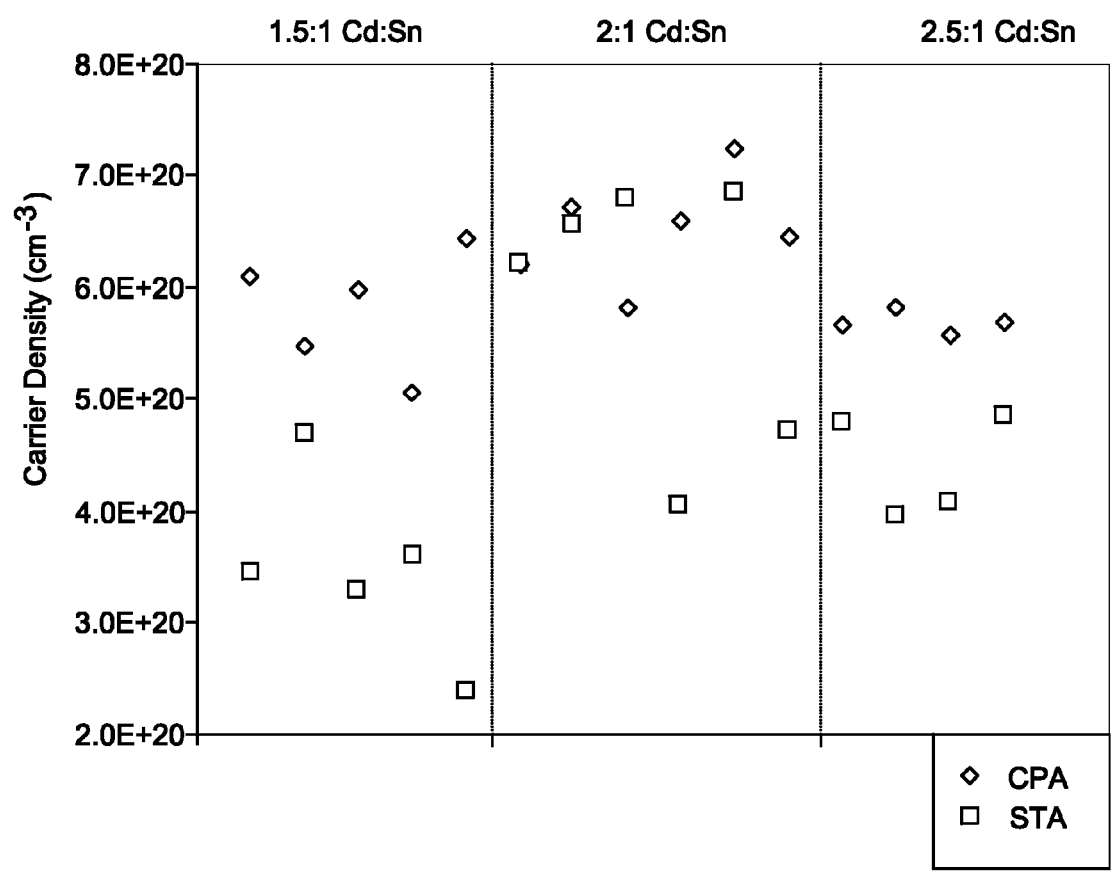
FIG. 12 shows the carrier density of transparent layer deposited by reactive sputtering using targets having different Cd:Sn atomic ratios, according to an exemplary embodiment of the invention.
Figure 13:
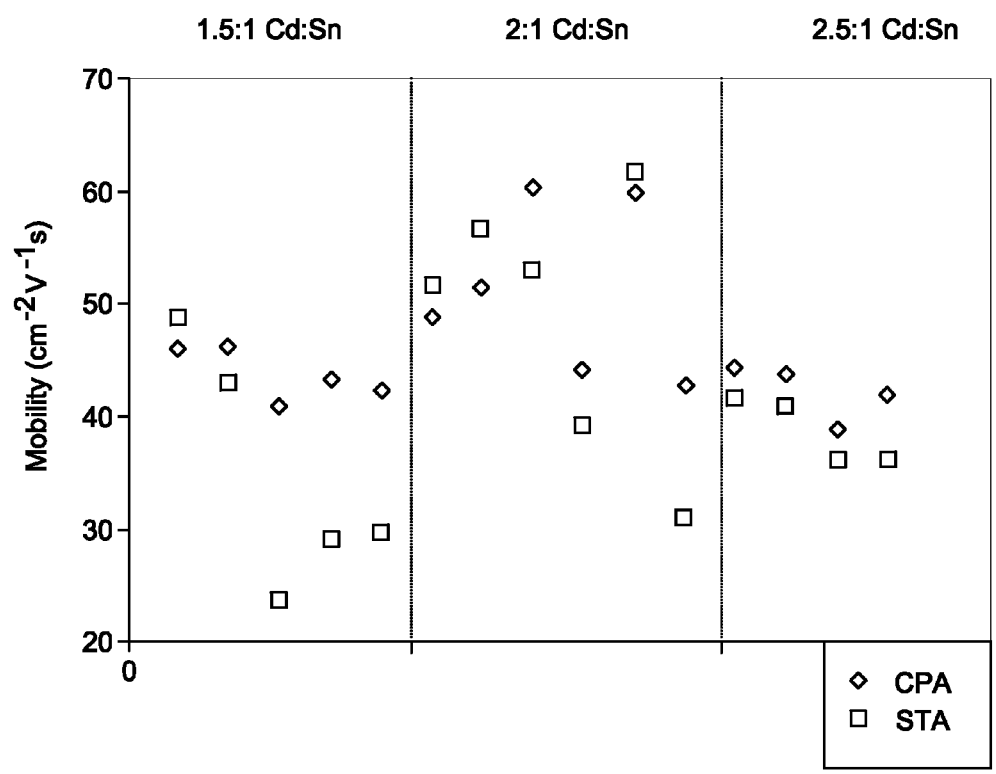
FIG. 13 shows the mobility of transparent layer deposited by reactive sputtering using targets having different Cd:Sn atomic ratios, according to an exemplary embodiment of the invention.

FIG. 11 shows the comparison between the electrical resistivity values for CPA and STA-annealed CTO films sputtered using different target concentrations and using different sputtering conditions. As illustrated in FIG. 11, at a cadmium to tin atomic ratio of 2:1, the resistivity values were comparable between the CPA and STA-annealed CTO films. FIGS. 12 and 13 show the carrier density and mobility values for CPA and STA-annealed CTO films sputtered using different target concentrations and using different sputtering conditions. As shown in FIGS. 12 and 13, the carrier density and mobility values decrease as cadmium to tin atomic ratio increases from 2:1 to 2.5:1.

Figure 14:
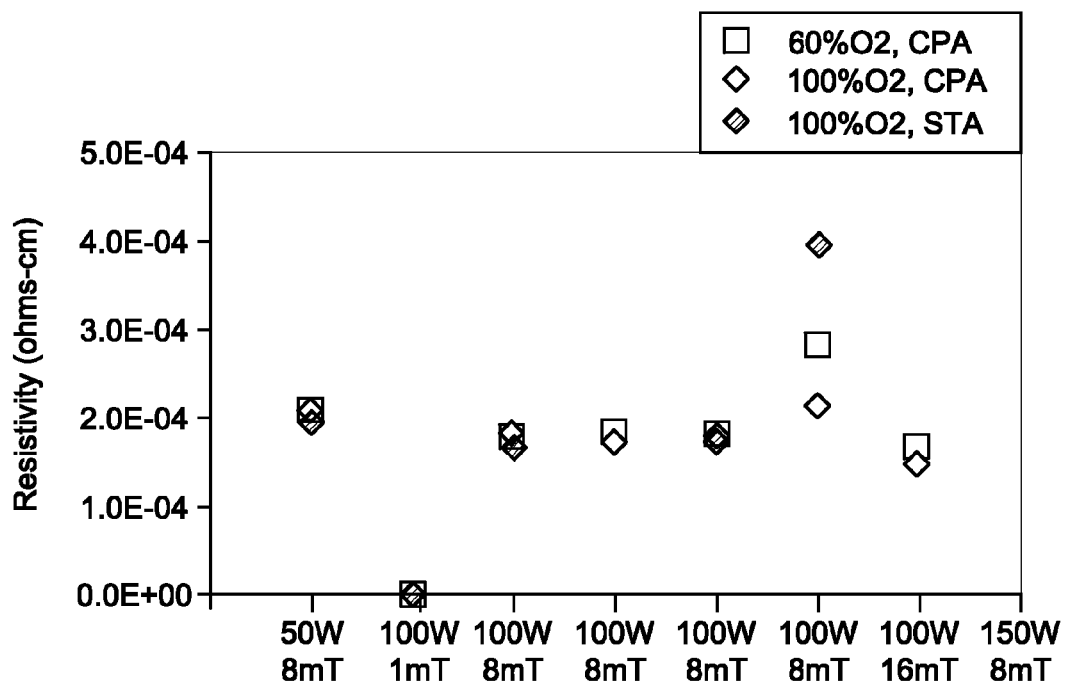
FIG. 14 shows the effect of reactive sputtering conditions on electrical resistivity of transparent layer, according to an exemplary embodiment of the invention.
Figure 15:
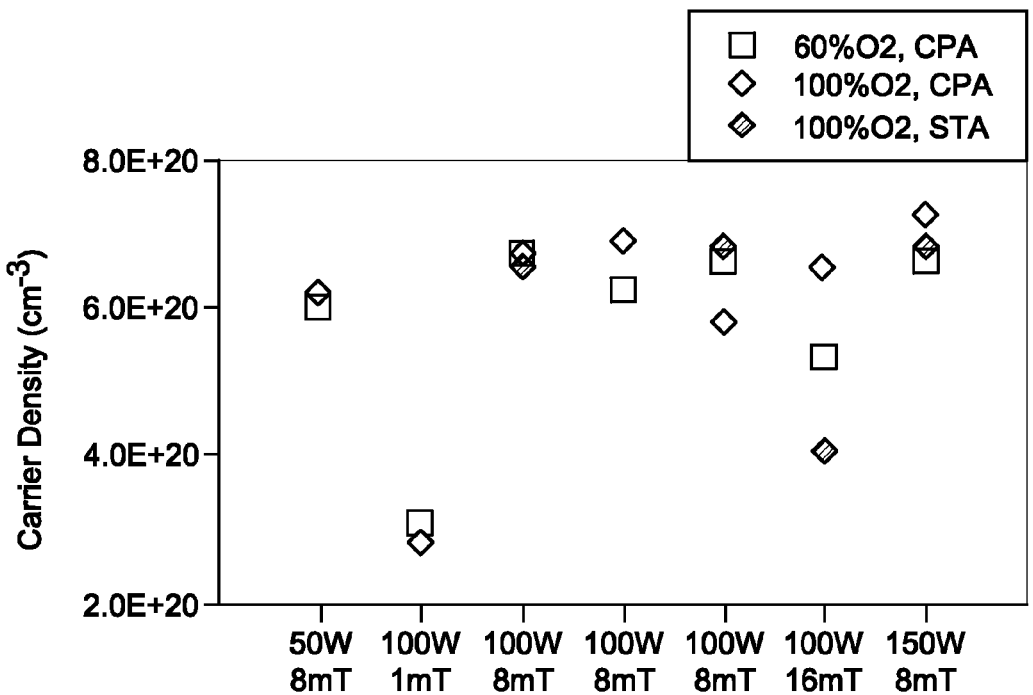
FIG. 15 shows the effect of reactive sputtering conditions on carrier density of transparent layer, according to an exemplary embodiment of the invention.
Figure 16:
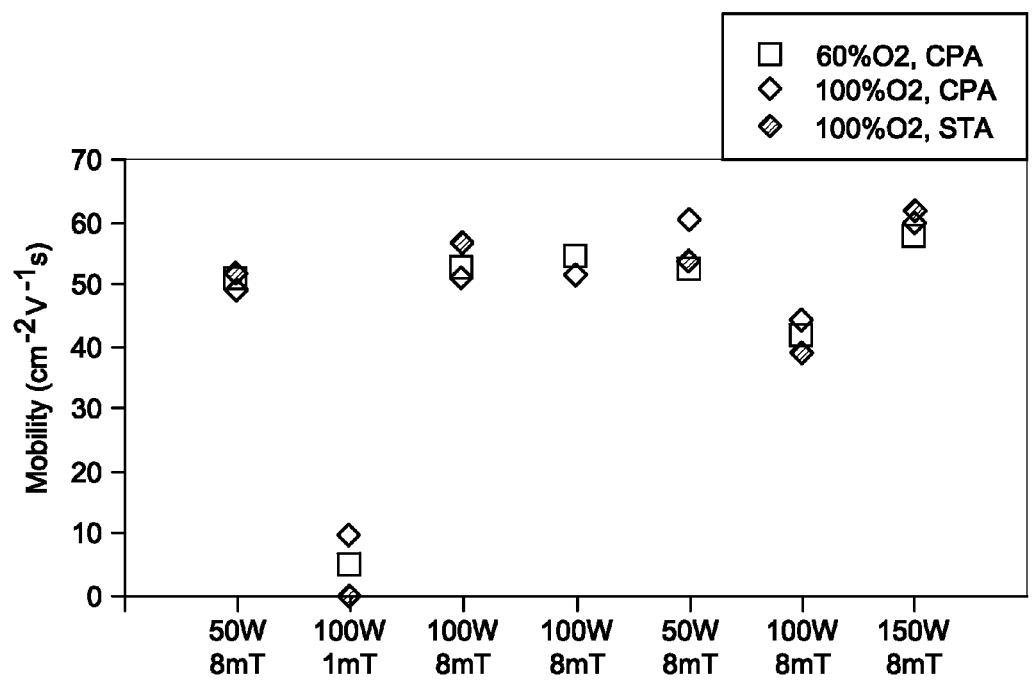
FIG. 16 shows the effect of reactive sputtering conditions on mobility of transparent layer, according to an exemplary embodiment of the invention.

FIGS. 14-16 show the electrical resistivity, carrier concentration, and mobility values respectively for CPA and STA-annealed CTO films sputtered using a target Cd:Sn ratio of 2:1 as a function of different sputtering conditions. As illustrated in FIGS. 14-16, higher sputtering power and higher sputtering pressure result in higher electrical resistivity, carrier concentration, and mobility values, indicating that electrical and optical properties of the transparent layer may be advantageously controlled by varying the sputtering conditions. Further, the optical and electrical properties for the CPA and the conventional STA-annealed CTO films were comparable, thus obviating the need for a separate CdS-based annealing step. All the values reported in FIGS. 6-16 were obtained in the same laboratory using the same equipment and analytical techniques.

Example 7

Comparison Between Electrical Properties of CTO Films Reported in Literature and the CTO Films Sputtered and Annealed According to Some Embodiments of the Invention The CTO films prepared in Examples 1 and 4 were also annealed using a combination of different target concentrations, annealing temperatures, different time durations, and under different pressure conditions using both the standard thermal annealing method (STA) and cadmium proximity annealing (CPA) method. The cadmium to tin atomic ratio in as-deposited amorphous CTO film was determined using XPS and was determined to be in a range from about 1.77 to about 2:1. As described earlier, annealing time duration of 0 minutes means that the CTO film was ramped to the desired annealing temperature and once the annealing temperature was reached, it was immediately removed from the furnace.

TABLE 3

Deposition and annealing conditions for CTO films according to some embodiments of the invention and for the CTO films disclosed in the literature.

| | CTO film Depositing | | Annealing | | |
|---|---|---|---|---|---|
| Sample | Target (Cd:Sn) Ratio | Amorphous CTO film (Cd:Sn) Ratio | Temp (°C.) | Time (min) | Pressure and environment |
| 1[a] | 2:1 | 1.77:1 | 630 | 20 | 480 Torr $N_2$ |
| 2[a] | 2:1 | 1.77:1 | 630 | 20 | 200 Torr $N_2$ |
| 3[a] | 2:1 | 1.77:1 | 630 | 20 | 90 Torr $N_2$ |
| 4[a] | 2:1 | 1.77:1 | 630 | 20 | 172 Torr $N_2$ |
| 5[a] | 2:1 | 1.77:1 | 600 | 0 | 145 Torr $N_2$ |
| 6[a] | 2:1 | 1.77:1 | 600 | 20 | 269 Torr $N_2$ |
| 7[a] | 2:1 | 1.77:1 | 630 | 20 | 163 Torr $N_2$ |
| 8[a] | 2:1 | 1.77:1 | 660 | 0 | 157 Torr $N_2$ |
| 9[a] | 2:1 | 1.77:1 | 660 | 20 | 182 Torr $N_2$ |
| 10[a] | 2:1 | 1.77:1 | 630 | 20 | 158 Torr $N_2$ |
| 11[a] | 2:1 | 1.77:1 | 630 | 20 | 156 Torr $N_2$/CdS |
| 12[b] | 2:1 | 2:1 | 630 | 20 | 240 Torr $N_2$ |
| 13[b] | 2.5:1 | 2.5:1 | | | 2 |
| 14[b] | 2:1 | 2:1 | 630 | 20 | 248 Torr $N_2$/CdS |
| 15[b] | 2.5:1 | 2.5:1 | | | 2 |
| 16[b] | 1.5:1 | 1.5:1 | 630 | 20 | 153 Torr $N_2$/CdS |
| 17[b] | 1.5:1 | 1.5:1 | 630 | 20 | 165 Torr $N_2$ |
| Wu, Thin Solid Films, 1996 (286) 274-276[c] | 2:1 | — | 680 | 10-30 | Ar/CdS |
| Miyake et. al. U.S. Pat. No. 4,349,425[d] | 2:1 | — | 200-400 | — | $4 \times 10^{-6}$ Torr (vaccum) $5 \times 10^{-2}$ Torr Ar |
| Tahar et. al., J Am Ceram Soc, 2001 (84) 85-91[e] | — | — | 680 | 30 | Flowing $N_2$ |
| Mamazza Jr. et. al., Thin Solid Films, 2005 (484) 26-33[f] | — | 2.15:1 | 600 | 20 | 500 Torr $H_2$/He |

[a]Samples 1-11 were deposited by non-reactive DC magnetron sputtering from a ceramic cadmium stannate target sputtered at room temperature, in the presence of $O_2$ (>90%), at a sputtering pressure of 16 milliTorr.
[b]Samples 12-15 were deposited by reactive DC magnetron sputtering using Cd/Sn mixed metal target at 150 W, 8 milliTorr in 100% $O_2$.
[b]Sample 16 was deposited by reactive DC magnetron sputtering using Cd/Sn mixed metal target at 60 W, 8 milliTorr in 100% $O_2$.
[b]Sample 17 was deposited by reactive DC magnetron sputtering using Cd/Sn mixed metal target at 100 W, 8 milliTorr in 100% $O_2$.
[c]Thin films were deposited by non-reactive DC magnetron sputtering from a ceramic cadmium stannate target sputtered at room temperature, in the presence of $O_2$ (100%), at 10-17.5 milli Torr.
[d]Thin films were deposited by DC reactive sputtering using Cd/Sn alloy at 2-2.5 kV, 10 milliTorr using 2-100% $O_2$.
[e]Thin films were prepared by dip coating using cadmium acetate and tin isopropoxide.
[f]Thin films were prepared by RF magnetron co-sputtering from cadmium oxide and tin oxide targets at room temperature, in the presence of Ar (100%), at 3 milliTorr.
"—" indicates that the depositing or annealing conditions were not available from the literature.

Table 4 shows the comparison between the electrical properties for CTO films according to some embodiments of the invention and for the CTO films disclosed in the literature. As illustrated in Table 4, by sputter depositing an amorphous CTO film (Cd:Sn~1.77) from a ceramic target and by using the standard thermal annealing method, a CTO film (Sample 3) having a resistivity of $1.38 \times 10^4$ Ohm-cm, mobility of 52.4 cm$^2$/V.s, and a carrier density of $8.64 \times 10^{20}$ cm$^{-3}$ was advantageously obtained. These properties were comparable to the best-reported values (resistivity of $1.28 \times 10^4$ Ohm-cm, mobility of 54.5 cm$^2$/V.s, and a carrier density of $8.94 \times 10^{20}$ cm$^{-3}$) films were deposited using co-sputtering a amorphous CTO film having a Cd:Sn ratio of 2.15. However, the mobility values and the carrier density values achieved by Mamazza Jr. et al. are significantly lower. As noted earlier, crystalline CTO films having a combination of low absorbance, low resistivity, high mobility, and high carrier density may be desirable for advancing the efficiency and manufacturability of thin film solar cells. Method for making crystalline CTO films having such an advantageous combination of electrical and optical properties is provided according to some embodiments of the present invention.

TABLE 4

Comparison between the electrical properties for CTO films according to some embodiments of the invention and for the CTO films disclosed in the literature. The best achieved electrical properties as reported in the literature have been tabulated

| Sample | Thickness (nm) | Sheet Resistance (Ohm/sq) | Resistivity ($\times 10^{-4}$ Ohm-cm) | Mobility (cm$^2$/V·s) | Carrier Density ($\times 10^{20}$ cm$^{-3}$) |
|---|---|---|---|---|---|
| 1 | 200 | 6.9 | 1.38 | 52.4 | 8.64 |
| 2 | 214 | 7.01 | 1.47 | 47.1 | 9.00 |
| 3 | 214 | 10.78 | 2.12 | 45.7 | 6.44 |
| 4 | 220 | 7.700 | 1.69 | 53.3 | 6.96 |
| 5 | 230 | 9.268 | 2.13 | 37.4 | 8.26 |
| 6 | 223 | 7.319 | 1.63 | 49.3 | 8.06 |
| 7 | 212 | 7.591 | 1.61 | 49.4 | 7.99 |
| 8 | 229 | 6.925 | 1.59 | 45.4 | 8.99 |
| 9 | 215 | 8.217 | 1.77 | 54.1 | 6.62 |
| 10 | 217 | 7.27 | 1.58 | 53.2 | 7.35 |
| 11 | 225 | 5.6 | 1.28 | 52 | 9.14 |
| 12 | 226 | 6.54 | 1.48 | 61.66 | 6.85 |
| 13 | 235 | 9.65 | 2.27 | 42.79 | 6.44 |
| 14 | 226 | 6.36 | 1.44 | 66.3 | 6.55 |
| 15 | 221 | 14.25 | 3.15 | 41.46 | 4.78 |
| 16 | 213 | 10.44 | 2.22 | 45.98 | 6.1 |
| 17 | 215 | 14.43 | 3.12 | 42.8 | 4.68 |
| Wu et. al., Thin Solid Films, 1996 (286) 274-276[c] | 510 | 2.5 | 1.28 | 54.5 | 8.94 |
| Miyake et. al., U.S. Pat. No. 4,349,425[d] | 24.5 | 363 | 8.89 | 29.4 | 2.69 |
| Tahar et. al., J. Am. Ceram. Soc, 2001 (84) 85-91[e] | | 14.3 | 3.3 | 12.0 | 15.5 |
| Mamazza Jr. et. al., Thin Solid Films, 2005 (484) 26-33[f] | 200 | | 2.07 | 32.3 | 7.4 | in the literature by Wu et al. Further, as illustrated in Table 4, by reactive sputtering an amorphous CTO film (Cd:Sn~2:1) from a mixed metal target and using the standard thermal annealing method, a CTO film (Sample 14) having a resistivity of $1.48 \times 10^4$ Ohm-cm, mobility of 61.66 cm$^2$/V.s, and a carrier density of $6.85 \times 10^{20}$ cm$^{-3}$ was advantageously obtained. Further, the electrical properties obtained for CTO films having an Cd:Sn ratio ~1.77 (sample 3) and Cd:Sn ratio ~2 (sample 14) were significantly better than the properties reported in the literature for CTO films annealed in the absence of CdS. Furthermore, significantly improved electrical and optical properties using an amorphous CTO film having a Cd:Sn ratio of about 1.77 to about 2:1 are obtained in comparison to the properties reported by Mamazza Jr. et al. for the same Cd:Sn ratio. For example, the resistivity values reported by Mamazza et al. for Cd:Sn ratio in a range from 1.5:1 to 2:1 are three to four times higher than the resistivity values obtained according to some embodiments of the invention. The best achieved resistivity value as reported by Mamazza Jr. et al. is $2.07 \times 10^{-4}$ Ohm-cm, wherein the CTO Example 8

CdTe Cells Fabricated Using CTO Films Annealed by CdS Proximity Annealing Method and by Standard Thermal Annealing Method CdTe solar cells were fabricated on CTO films annealed using standard thermal annealing process (Example 2) to compare their performance with that of cells fabricated on CdS close-proximity annealed CTO (Example 3). A set of 1.5 inch×1.5 inch parts including ~200 nm-thick, annealed CTO film on 1.3 mm-thick Corning glass were validated by conducting a device integration run. Four parts were annealed using standard thermal annealing (STA) process and two parts were annealed using the CdS close-proximity annealing (CPA) process. All the parts were washed and coated with a 105 nm-thick 5% Zn:SnO$_2$ (ZTO) film. The devices were manufactured using: 80 nm CdS:O(5%), 3μ oxygenated CdTe deposited at 550° C., CdCl$_2$ activation process and a gold back contact layer. The samples were measured in solar simulator without cell isolation.

TABLE 5

The initial R$_{sheet}$ and optical absorption characteristics of the annealed parts used for the device integration.

| Sample No. | Annealing Process | R$_{sheet}$ (Ohm/Square) | Optical Absorption (%) |
|---|---|---|---|
| 1 | CPA | 6.3 | 3.78 |
| 2 | CPA | 6.3 | 3.78 |
| 3 | STA | 6.75 | 3.17 |
| 4 | STA | 10.53 | 3.12 |
| 5 | STA | 6.69 | 3.82 |
| 6 | STA | 8.73 | 3.19 |

Figure 17:
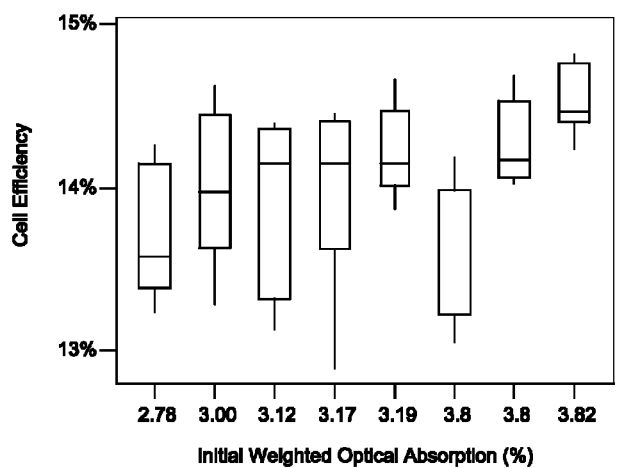
FIG. 17 shows the photovoltaic cell efficiency and optical absorption, according to an exemplary embodiment of the invention.
Figure 18:
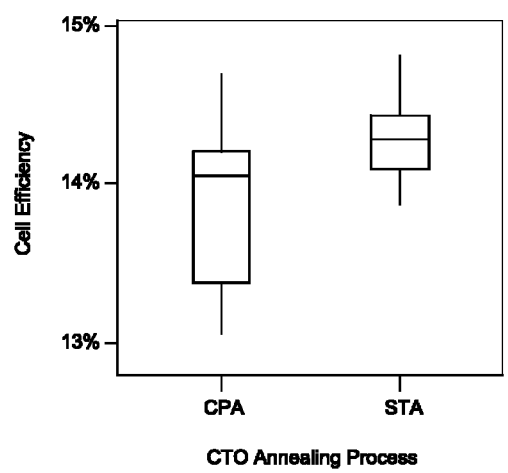
FIG. 18 shows the comparison between the photovoltaic cell efficiency values obtained using CTO films annealed by standard thermal annealing and CdS proximity annealing, according to an exemplary embodiment of the invention.

All the parts used for this device integration had an initial weighted optical absorption of less than 5%, as shown in Table 5. FIG. 17 shows the cell efficiency distribution as a function of the initial optical absorption of each part. FIG. 18 shows the efficiency distribution by annealing process (STA versus CPA). The results shown in FIG. 17 illustrate that using the standard thermal annealing process to anneal the as-deposited CTO films appears to have no detrimental effect on the performance of CdTe cells. FIG. 18 shows that there is no direct correlation between the initial optical absorption of the parts used in this study and the short circuit current (J$_{sc}$) of the cells fabricated on those parts. The highest average J$_{sc}$ was obtained in the part with the highest initial optical absorption.

The foregoing examples are merely illustrative, serving to exemplify only some of the features of the invention. The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of." Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. A method, comprising:
   disposing a substantially amorphous cadmium tin oxide layer in an atmosphere comprising oxygen at a concentration greater than about 60% by volume on a support; and
   thermally processing the substantially amorphous cadmium tin oxide layer at a temperature in a range from about 550° C. to about 650° C., in an atmosphere substantially free of cadmium from an external source, and at pressure conditions less than atmospheric pressure, to form a transparent layer,
   wherein the transparent layer comprises cadmium tin oxide having a substantially single-phase spinel crystal structure, and has an electrical resistivity less than about 2×10$^{-4}$ Ohm-cm wherein an atomic ratio of cadmium to tin in the substantially amorphous cadmium tin oxide layer is less than about 2.5:1.

2. The method of claim 1, wherein the transparent layer has an electrical resistivity less than about 1.8×10$^{-4}$ Ohm-cm.

3. The method of claim 1, wherein the transparent layer has an electrical resistivity less than about 1.5×10$^{-4}$ Ohm-cm.

4. The method of claim 1, wherein an atomic ratio of cadmium to tin in the substantially amorphous cadmium tin oxide layer is equal to or less than about 2:1.

5. The method of claim 1, wherein an atomic ratio of cadmium to tin in the substantially amorphous cadmium tin oxide layer is equal to or less than about 1.8:1.

6. The method of claim 1, wherein an atomic ratio of cadmium to tin in the substantially amorphous cadmium tin oxide layer is in a range from about 1.7:1 to about 2.1.

7. The method of claim 1, wherein thermally processing comprises heating the amorphous cadmium tin oxide layer at a treatment temperature, under vacuum conditions, and for a time duration sufficient to allow formation of the transparent layer.

8. The method of claim 1, wherein thermal processing comprises heating the substantially amorphous cadmium tin oxide layer for a time duration in a range from about 1 minute to about 60 minutes.

9. The method of claim 1, wherein thermal processing is conducted at a pressure less than about 500 Torr.

10. The method of claim 1, wherein thermal processing is conducted at a pressure equal to or less than about 250 Torr.

11. The method of claim 1, wherein disposing a substantially amorphous cadmium tin oxide layer comprises sputtering, evaporation, chemical vapor deposition, spin coating, or dip coating.

12. The method of claim 1, wherein disposing a substantially amorphous cadmium tin oxide layer comprises sputtering from one or more target having an atomic ratio of cadmium to tin in a range from about 1.5:1 to about 2.5:1.

13. The method of claim 1, wherein disposing a substantially amorphous cadmium tin oxide layer comprises sputtering from one or more target having an atomic ratio of cadmium to tin in a range from about 1.5:1 to about 2:1.

14. The method of claim 1, wherein disposing a substantially amorphous cadmium tin oxide layer comprises sputtering from a single target comprising cadmium tin oxide.

15. The method of claim 1, wherein disposing a substantially amorphous cadmium tin oxide layer comprises reactive sputtering from a single target comprising cadmium and tin.

16. The method of claim 1, wherein the transparent layer comprises:
   (a) a first region comprising cadmium tin oxide; and
   (b) a second region comprising cadmium, tin, and oxygen, wherein an atomic concentration of cadmium in the second region is less than an atomic concentration of cadmium in the first region.

17. The method of claim 1, wherein the transparent layer has a thickness in a range of from about 100 nm to about 400 nm.

18. The method of claim 1, wherein the transparent layer has a mobility greater than about 45 cm2/Vs.

19. The method claim 1, wherein the transparent layer has an average optical transmission greater than about 95%.

20. The method of claim 1, wherein thermal processing is conducted in the presence of nitrogen, argon, or combinations thereof.

21. A method, comprising:
- disposing a substantially amorphous cadmium tin oxide layer on a support by reactive sputtering from one or more target in an atmosphere comprising oxygen at a concentration greater than about 60% by volume; and
- thermally processing the substantially amorphous cadmium tin oxide layer at a temperature in a range from about 550° C. to about 650° C., in an atmosphere substantially free of cadmium from an external source, and at pressure conditions less than atmospheric pressure, to form a transparent layer,
- wherein the transparent layer comprises cadmium tin oxide having a substantially single-phase spinel crystal structure, and has an electrical resistivity less than about $2\times10^{-4}$ Ohm-cm wherein an atomic ratio of cadmium to tin in the substantially amorphous cadmium tin oxide layer is less than about 2.5:1.

22. The method of claim 21, wherein an atomic ratio of cadmium to tin in the one or more target is equal to or less than about 2:1.

23. The method of claim 21, wherein disposing a substantially amorphous cadmium tin oxide layer comprises reactive sputtering from a target comprising cadmium and tin.

24. The method of claim 21, wherein disposing a substantially amorphous cadmium tin oxide layer comprises reactive sputtering from a first target comprising cadmium and a second target comprising tin.

25. The method of claim 21, wherein disposing a substantially amorphous cadmium tin oxide layer comprises reactive sputtering from one or more target in an atmosphere comprising oxygen at a concentration greater than about 60% by volume.

26. The method of claim 21, wherein disposing a substantially amorphous cadmium tin oxide layer comprises reactive sputtering from one or more target at a pressure in a range from about 1 milliTorr to about 20 milliTorr.

27. The method of claim 21, wherein the transparent layer has an electrical resistivity less than about $1.5\times10^{-4}$ Ohm-cm.

28. The method claim 21, wherein the transparent layer has an average optical transmission greater than about 95%.

29. A method, comprising:
- disposing a substantially amorphous cadmium tin oxide layer in an atmosphere comprising oxygen at a concentration greater than about 60% by volume on a support;
- thermally processing the substantially amorphous cadmium tin oxide layer at a temperature in a range from about 550° C. to about 650° C., in an atmosphere substantially free of cadmium from an external source, and at pressure conditions less than atmospheric pressure, to form a transparent layer, wherein the transparent layer comprises cadmium tin oxide having a substantially single-phase spinel crystal structure, and has an electrical resistivity less than about $2\times10^{-4}$ Ohm-cm;
- disposing a first semiconductor layer on the transparent layer;
- disposing a second semiconductor layer on the first semiconductor layer; and
- disposing a back contact layer on the second semiconductor layer to form a photovoltaic device.

30. The method of claim 29, wherein the first semiconductor layer comprises cadmium sulfide.

31. The method of claim 29, wherein the second semiconductor layer comprises cadmium telluride.

32. The method of claim 29, further comprising disposing a buffer layer between the transparent layer and the first semiconductor layer.

33. The method of claim 29, wherein the buffer layer comprises an oxide selected from the group consisting of tin oxide, indium oxide, zinc oxide, and combinations thereof.

\* \* \* \* \*